United States Patent
Kawabata et al.

(10) Patent No.: US 7,548,468 B2
(45) Date of Patent: Jun. 16, 2009

(54) SEMICONDUCTOR MEMORY AND OPERATION METHOD FOR SAME

(75) Inventors: Kuninori Kawabata, Kawasaki (JP); Shuzo Otsuka, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 255 days.

(21) Appl. No.: 11/508,927

(22) Filed: Aug. 24, 2006

(65) Prior Publication Data
US 2006/0285405 A1 Dec. 21, 2006

Related U.S. Application Data

(63) Continuation of application No. PCT/JP2004/003168, filed on Mar. 11, 2004.

(51) Int. Cl.
*G11C 7/00* (2006.01)
(52) U.S. Cl. ............... 365/189.11; 365/189.09; 365/191; 365/203; 365/235
(58) Field of Classification Search ............ 365/189.11, 365/189.09, 191, 203, 235, 149–150
See application file for complete search history.

(56) References Cited

U.S. PATENT DOCUMENTS

| 6,262,930 B1* | 7/2001 | Mori et al. ............ 365/226 |
| 6,307,806 B1* | 10/2001 | Tomita et al. ........... 365/233.1 |
| 6,373,783 B1* | 4/2002 | Tomita ................. 365/233.1 |
| 6,667,933 B2* | 12/2003 | Tomita ................. 365/233.14 |

FOREIGN PATENT DOCUMENTS

| JP | 1-122095 A | 5/1989 |
| JP | 3-122892 A | 5/1991 |
| JP | 5-166368 A | 7/1993 |
| JP | 7-85658 A | 3/1995 |
| JP | 7-296581 A | 11/1995 |

* cited by examiner

*Primary Examiner*—Pho M. Luu
(74) *Attorney, Agent, or Firm*—Fujitsu Patent Center

(57) ABSTRACT

A bit line resetting signal is supplied to the gate of an nMOS transistor (or a precharge circuit) which connects a bit line with a precharge voltage line. The high-level voltage of the bit line resetting signal is retained at a first voltage during the precharge operation after a refresh operation, and is retained at a second voltage higher than the first voltage during the precharge operation after an access operation. In the precharge operation after the refresh operation, therefore, the second voltage is not used so that the current consumption of the generating circuit of the second voltage is reduced. Thus, it is possible to reduce the current consumption (or the standby current) during the standby period for which the internal refresh requests continuously occur.

26 Claims, 14 Drawing Sheets

SEMICONDUCTOR MEMORY AND OPERATION METHOD FOR SAME

CROSS REFERENCE TO RELATED APPLICATION

This application is a continuation application of International Application PCT/JP 2004/003168, filed Mar. 11, 2004, designating the U.S.

BACKGROUND OF THE INVENTION

1. Field of the Invention

The present invention relates to a semiconductor memory having dynamic memory cells needing a refresh operation, and to an operation method therefor.

2. Description of the Related Art

Recently, a semiconductor memory called the pseudo-SRAM has been noted. The pseudo-SRAM has memory cells of DRAM, and operates as the SRAM by internally executing the refresh operation on the memory cell automatically. There is a demand for a pseudo-SRAM, as mounted on a portable equipment such as a mobile phone energized by a battery as a power source, to have a low current consumption in order to elongate the operation time of the portable equipment. Especially, there is a strong demand for reducing the standby current because it leads to a reduction of the current consumption during non-operation period of the portable equipment. For example, the mobile phone is enabled to have a long waiting time by reducing the current consumption while it is non-operative.

In recent years, on the other hand, in order to meet the demands for the reduction of the gate breakdown voltage and the low power current due to the miniaturization of the transistor structure, the operation voltage of a semiconductor integrated circuit has been on the decrease as well as the power supply voltage to be fed from the outside. The threshold value of the transistor hardly depends on the power supply voltage. As a result, the ratio of the threshold value of the transistor to the power supply voltage is enlarged by lowering the operation voltage. In the circuit, in which the source voltage of the nMOS transistor is higher than the earth voltage, for example, the gate-to-source voltage relatively decreases. As a result, the on-resistance of the transistor rises so that the switching speed decreases. The on-resistance of the transistor is lowered by applying a higher voltage than the power supply voltage to the gate.

Generally in the semiconductor memory such as a pseudo-SRAM and DRAM, a higher voltage (or a boost voltage) than the external power supply voltage is established by a boost circuit. The boost voltage is used for the high-level voltage of the word line and the high-level voltage of the bit line resetting signal. Here, the word line is connected with the gate of a transfer transistor for connecting the bit line with a memory cell capacitor. The signal line of the bit line resetting signal is connected with the gate of the transistor for connecting the bit line with the precharge voltage line. By using the boost voltage as the high-level voltage of the word line, the electric charge amount to be written in the memory cell can be enlarged to improve the data retention characteristics of the memory cell. By using the boost voltage as the high-level voltage of the bit line resetting signal, the bit line can be precharged for a short time to thereby shorten the access time.

However, the boost voltage is generated inside the semiconductor memory, needing an electric power for that. Therefore, the use of the boost voltage leads to the increase in the current consumption. Especially, the use of the boost voltage for the standby period exerts serious influences on the standby current.

Here, Japanese Unexamined Patent Application Publication No. 7-85658 has disclosed the technique for the DRAM by which the high-level voltage of the bit line in a self-refresh mode is made lower than the high-level voltage of the bit line in the normal operation mode. In a case that the high-level voltage of the bit line is lowered in the self-refresh mode, however, the electric charge amount to be stored in the memory cell decreases to shorten the refresh period. As a result, the effect to reduce the standby current is low.

SUMMARY OF THE INVENTION

It is an object of the invention to reduce the current consumption of a semiconductor memory having a dynamic memory cell, especially, to reduce the standby current of a pseudo-SRAM.

According to one aspect of the invention, the memory core of a semiconductor memory includes a plurality of dynamic memory cells, a bit line connected with the dynamic memory cells, and a precharge circuit. The precharge circuit has an nMOS transistor which connects the bit line with the precharge voltage line. The high-level voltage of the bit line resetting signal to be fed to the gate of the nMOS transistor is switched to a first voltage or a second voltage higher than the first voltage in response to a switch control signal. For example, the first voltage is an internal supply voltage which is generated by stepping down the external supply voltage fed through the power supply terminal. The second voltage is a boost voltage which is generated by boosting the external supply voltage.

When the first voltage is fed to the gate, the gate-to-source voltage of the nMOS transistor relatively lowers. As a result, the on-resistance increases, and the precharge operation time of the bit line lengthens. When the second voltage is fed to the gate, on the other hand, the gate-to-source voltage of the nMOS transistor relatively heightens. As a result, the on-resistance lowers, and the precharge operation time of the bit line shortens. By feeding the first voltage to the gate, the usage frequency of the second voltage lowers so that, for example, the current consumption of the booster circuit for generating the second voltage can be reduced. Applying a first voltage to the gate according to the operation state of the memory core, therefore, makes it possible to reduce the power consumption of the semiconductor memory.

According to another aspect of the invention, a bit line resetting signal is retained at a second voltage during the precharge operation following the access operation which responds to an access request, and it is retained at a first voltage during a precharge operation following the refresh operation which responds to an internal refresh request. The second voltage is not used in the precharge operation after the refresh operation. As a result, it is possible to reduce the current consumption (or a standby current) for the standby period for which internal refresh requests continuously occur.

According to another aspect of the invention, the voltage of the power line to be used for a high-level voltage of the bit line resetting signal is set to the first voltage in response to the first internal refresh request after the access operation, and it is set to the second voltage in response to the first access request after the refresh operation. This enables the high-level voltage to be set with a margin before the precharge operation is started. As a result, the circuit design and the timing design can be easily made.

According to another aspect of the invention, the voltage of the power supply line to be used as the high-level voltage of the bit line resetting signal is switched to the first voltage or the second voltage during a period in which the bit line resetting signal is at the low logic level. That is, the voltage of the power supply line is switched during the non-precharge period of the bit line. When the high-level voltage of the bit line resetting signal is set at the second voltage, it is possible to prevent the charge (or the second voltage) of the signal line of the bit line resetting signal from being injected into the voltage line of the first voltage due to the switching from the second voltage to the first voltage. As a result, the first voltage can be prevented from fluctuating, thereby stabilizing the operation of the semiconductor memory. It is essential to prevent the fluctuation of the first voltage especially when generating the first voltage by stepping down the external supply voltage.

According to another aspect the invention, an arbiter determines, when an access request and an internal refresh request conflict with each other, an order to execute an access operation responding to the access request and an refresh operation responding to the internal refresh request, and sequentially outputs an access control signal to execute the access operation and a refresh control signal to execute the refresh operation in accordance with the order of execution determined. The voltage of the power supply line to be used for the high-level voltage of the bit line resetting signal is set to the first voltage in response to the refresh control signal and it is set to the second voltage in response to the access control signal. Therefore, the voltage of the power supply line can be set in synchronism with the start of the access operation or the refresh operation. As a result, in the precharge operations after the refresh operation and after the access operation, the bit line resetting signal can be set to the first voltage and second voltage with a margin.

According to another aspect of the invention, the voltage of the power supply line to be used for the high-level voltage of the bit line resetting signal is switched from the first voltage to the second voltage in response to the access request, when this access request is fed during the refresh operation corresponding to the internal refresh request. Therefore, the precharge operation following the refresh operation is executed by using the second voltage so that the precharge time can be shortened. As a result, the access operation subsequent to the refresh operation can be started earlier to shorten the access cycle time.

According to another aspect of the invention, the high-level voltage of the bit line resetting signal is switched from the second voltage to the first voltage when the internal refresh request occurs continuously without interposing the access request. Moreover, the high-level voltage of the bit line resetting signal is switched from the first voltage to the second voltage when the access request occurs. Accordingly, during normal operation periods for which the access operation is frequently executed, it is possible to prevent the voltage of the power supply line to be used for the high-level voltage of the bit line resetting signal from being switched from the second voltage to the first voltage in response to the internal refresh request. No switching of the voltage of the power supply line occurs during the normal operation periods, thereby reducing the current consumption necessary for switching the voltage.

According to another aspect of the invention, an arbiter determines, when an access request and an internal refresh request conflict with each other, an order to execute an access operation responding to the access request and an refresh operation responding to the internal refresh request, and sequentially outputs an access control signal to execute the access operation and a refresh control signal to execute the refresh operation in accordance with the order of execution determined. When the access request is fed during the precharge operation responding to the internal refresh request, the high-level voltage of the bit line resetting signal is switched from the first voltage to the second voltage during the precharge operation in response to the access request. Therefore, when the internal refresh request and the access request conflict with each other and the access operation is executed after the refresh operation, the precharge operation time due to the refresh operation can be shortened. As a result, the access operation subsequent to the refresh operation can be started earlier to shorten the access cycle time.

According to another aspect of the invention, a first pulse generating circuit generates a first precharging timing signal having a first pulse width. A second pulse generating circuit generates a second precharge timing signal having a second pulse width shorter than the first pulse width. The selecting circuit selects the first precharge timing signal when the high-level voltage of the bit line resetting signal is set at the first voltage, and selects the second precharge timing signal when the high-level voltage of the bit line resetting signal is set at the second voltage. The signal generating circuit generates the bit line resetting signal having the high-level voltage period corresponding to the pulse width of the first or second precharge timing signal selected. Therefore, it is possible to easily change the generation timing for the bit line resetting signal in response to the switching to the first voltage or the second voltage. According to the high-level voltage of the bit line resetting signal, it is possible to generate the bit line resetting signal at an optimal timing.

According to another aspect of the invention, the signal generating circuit has a CMOS inverter for outputting the bit line resetting signal. The CMOS inverter has a pMOS transistor connected at its source with the output node of the switch circuit for outputting the first voltage or the second voltage. By changing the source voltage of the pMOS transistor, therefore, the high-level voltage of the bit line resetting signal can be easily set to the first voltage or the second voltage.

According to another aspect of the invention, the switch circuit has a pMOS transistor and an nMOS transistor. The level shifter sets the high-level voltage (or the voltage for turning ON the nMOS transistor) of the switch control signal to the second voltage. The pMOS transistor receives the second voltage at its source, has its drain connected with the output node, and receives the switch control signal at its gate. The nMOS transistor receives the first voltage at its drain, has its source connected with the output node, and receives the switch control signal at its gate. When the nMOS transistor is turned ON, the gate-to-source voltage of the nMOS transistor can be raised to output the first voltage as the high-level voltage to the output node reliably. Thus, with this simple switch circuit, the first and second voltages can be reliably outputted according to the switch control signal.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
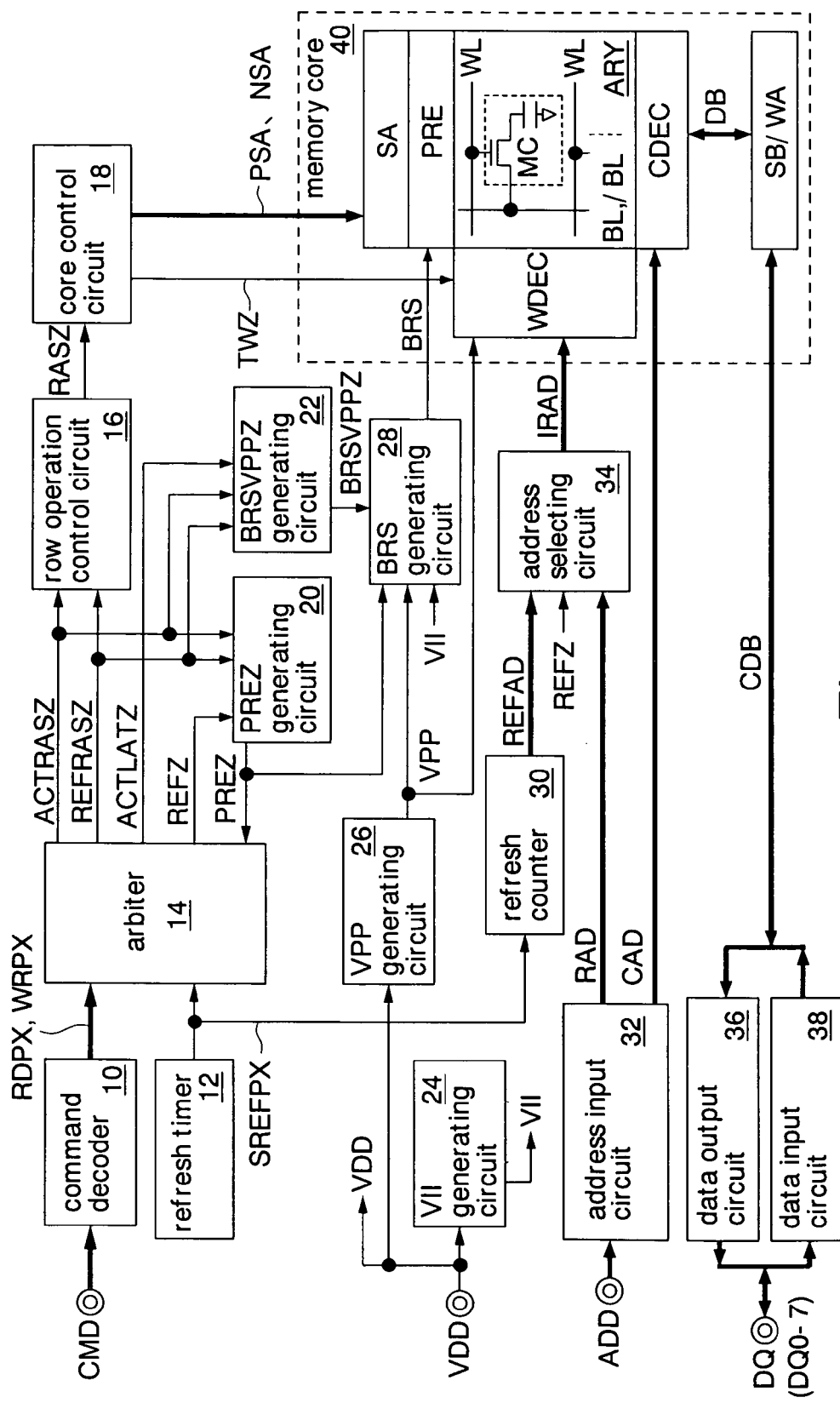
FIG. 1 is a block diagram showing a first embodiment of a semiconductor memory of the invention.

The invention is described in connection with its embodiments with reference to the accompanying drawings. In the drawings, double circles indicate external terminals. In the drawings, thick signal lines are composed of a plurality of lines. On the other hand, some of blocks connected with thick lines are composed of a plurality of circuits. Signals, as supplied through external terminals, are designated by the same reference characters as those of the terminal names. Moreover, the signal lines to have signals transmitted thereto use the same reference characters as those of the signal names. Both signals headed by "/" and signals tailed by "X" designate negative logic. Signals tailed by "Z" designate positive logic.

FIG. 1 shows a first embodiment of the semiconductor memory of the invention. The semiconductor memory is formed as a pseudo-SRAM having a DRAM memory cell (i.e., a dynamic memory cell) and an interface of SRAM. The pseudo-SRAM executes the refresh operation periodically in the chip without any refresh command from the outside, and retains the data written in the memory cell. This pseudo-SRAM is employed in a work memory to be mounted on a mobile phone, for example.

The pseudo-SRAM includes a command decoder 10, a refresh timer 12, an arbiter 14, a row operation control circuit 16, a core control circuit 18, a PREZ generating circuit 20, a BRSVPPZ generating circuit 22 (or a switch control circuit), a VII generating circuit 24 (or an internal supply voltage generating circuit), a VPP generating circuit 26 (or a boost voltage generating circuit), a BRS generating circuit 28, a refresh counter 30, an address input circuit 32, an address selecting circuit 34, a data output circuit 36, a data input circuit 38 and a memory core 40.

The command decoder 10 receives and decodes a command signal CMD (e.g., a chip enable signal /CE, an output enable signal /OE and a write enable signal /WE) supplied through a command terminal CMD, and outputs a read request signal RDPX for executing the read operation or a write request signal WRPX for executing the write operation.

The refresh timer 12 outputs a refresh request signal SREFPX for a predetermined period. The refresh request signal SREFPX is generated for the period, in which memory cells MC can be sequentially refreshed without losing the data retained in the memory cells MC. For example, the generation cycle of the refresh request signal SREFPX is so set that all the memory cells MC are once refreshed within 300 ms. For example, the refresh timer 16 is composed of a ring oscillator, and a frequency divider for dividing the periodic signal outputted from the ring oscillator so as to generate the refresh request signal SREFPX.

The arbiter 14 compares the transition edges of the read request signal RDPX and the write request signal WRPX (or the access request) and the transition edge of the refresh request signal SREFPX (or the internal refresh request) thereby to judge the competition of those requests, and decides which of the read operation, the write operation (or the access operation) and the refresh operation is to be executed earlier. In response to the read request signal RDPX or the write request signal WRPX, the arbiter 14 outputs an access latch signal ACTLATZ. In case it is decided that the access operation is given priority, the refresh request signal SREFPX is temporarily retained, and an access timing signal ACTRASZ (or an access control signal) is activated in response to the read request signal RDPX or the write request signal WRPX. The access timing signal ACTRASZ is a fundamental timing signal for determining the access operation timing of the memory core 40. The access timing signal ACTRASZ is retained at a high level till a precharge timing signal PREZ outputted from the PREZ generating circuit 20 is activated.

In case it is decided that the refresh operation is given priority, the arbiter 14 retains the read request signal RDPX or the write request signal WRPX temporarily, and activates a refresh timing signal REFRASZ (a refresh control signal) and a refresh signal REFZ in response to the refresh request signal SREFPX. The refresh timing signal REFRASZ is a fundamental timing signal for determining the refresh operation timing of the memory core 40. The refresh signal REFZ is a signal indicating that the refresh operation is being executed or can be executed. The refresh timing signal REFRASZ is retained at a high level till the precharge timing signal PREZ outputted from the PREZ generating circuit 20 is activated. The refresh signal REFZ is deactivated when the access timing signal ACTRASZ is outputted in response to a next access request.

In synchronism with the access timing signal ACTRASZ or the refresh timing signal REFRASZ, the row operation control circuit 16 outputs a row timing signal RASZ. This row timing signal RASZ is a signal for determining an activation period (tRAS) of a word line WL. The core control circuit 18 includes the not-shown word line control circuit and sense amplifier control circuit. In response to the row control signal RASZ, the word line control circuit outputs a word line control signal TWZ for selecting the later-described word line WL. In response to the row control signal RASZ, the sense amplifier control circuit outputs sense amplifier activating signals PSA and NSA for activating the sense amplifier of a later-described sense amplifier unit SA.

The row operation control circuit 16 and the core control circuit 18 operate as operation control circuits for causing the memory core 40 to execute the access operations in response to the access timing signal ACTRASZ and for causing the memory core 40 to execute the refresh operations in response to the refresh timing signal REFRASZ.

In response to the access timing signal ACTRASZ and the refresh timing signal REFRASZ, the PREZ generating circuit 20 activates the precharge timing signal PREZ at the individual predetermined timings. The activation period of the precharge timing signal PREZ determines the precharge period (tRP) of bit lines BL and /BL.

The BRSVPPZ generating circuit 22 sets a BRS setting signal BRSVPPZ (or a switch control signal) to a high level or a low level in response to the starting timing of an access operation and a refresh operation. The BRS setting signal BRSVPPZ is a signal for setting the high-level voltage of a bit line resetting signal BRS for controlling the operation of a precharging circuit unit PRE of the later-described memory core 40, to a boost voltage VPP or an internal supply voltage VII.

The VII generating circuit 24 steps down an external power source voltage VDD supplied through the external terminal, to generate the internal supply voltage VII (or the first voltage). The internal supply voltage VII is employed as the power supply voltage of the major logic circuit (excepting the I/O circuit such as the input buffer of the command decoder 10 and the output buffer of the data output circuit 36) of the pseudo-SRAM. The VPP generating circuit 26 boosts the external supply voltage VDD to generate the boost voltage VPP (or the second voltage). This boost voltage VPP is employed as the high-level voltage of the word lines WL and the control voltage of the precharging circuit unit PRE. The BRS generating circuit 28 generates the bit line resetting signal BRS for controlling the precharging circuit unit PRE, in synchronism with the precharge timing signal PREZ. The high-level voltage of the bit line resetting signal BRS is set according to the logic level of the BRS setting signal BRSVPPZ.

In response to the internal refresh request signal SREFPX, the refresh counter 30 performs a count operation to generate a refresh address signal REFAD sequentially. The address input circuit 32 receives the address signal ADD through an address terminal ADD, and outputs the received signal as a row address signal RAD (or an upper address) and as a column address signal CAD (or a lower address). Here, the pseudo-SRAM is a memory of an address non-multiplex type for receiving the upper address and the lower address at the same time. The address selecting circuit 34 outputs the refresh address signal REFAD as an internal row address signal IRAD, when the refresh signal REFZ is at the high level, and the row address signal RAD as the internal row address signal IRAD, when the refresh signal REFZ is at the low level. In other words, the refresh address signal REFAD is supplied to the memory core 40, when the refresh operation is executed, and the row address signal RAD is supplied to the memory core 40 when the read operation or the write operation is executed.

The data output circuit 36 receives the read data from the memory cell MC through a common data bus CDB, and outputs the received data to a data terminal DQ (DQ0-7). The data input circuit 38 receives the write data through the data terminal DQ (DQ0-7), and outputs the received data to the common data bus CDB.

The memory core 40 includes a memory cell array ARY, a word decoder unit WDEC, the sense amplifier unit SA, the precharging circuit unit PRE, a column decoder unit CDEC, a sense buffer unit SB and a write amplifier unit WA. The memory cell array ARY includes a plurality of volatile memory cells MC (or dynamic memory cells), and a plurality of word lines WL and a plurality of bit lines BL and /BL (or complementary bit lines) connected with the memory cells MC. Each memory cell MC is identical to the memory cell of the general DRAM, and has a capacitor for retaining the data as electric charges, and a transfer transistor arranged between that capacitor and the bit line BL (or /BL). The gate of the transfer transistor is connected with the word line WL. Any of the read operation, the write operation and the refresh operation is executed by the selection of the word line WL.

The word decoder unit WDEC selects, when it receives the word line control signal TWZ of the high level, any of the word lines WL in response to the internal row address signal IRAD, and changes the selected word line WL to the high level. In response to the column address signal CAD, the column decoder unit CDEC outputs column line signals to turn ON the column switches for connecting the bit lines BL and /BL and a data bus DB respectively.

The sense amplifier unit SA includes a plurality of sense amplifiers. Each sense amplifier operates, in response to the sense amplifier activating signals PSA and NSA, to amplify the signal amounts of the data on the bit lines BL and /BL. The data, as amplified by the sense amplifier, is transmitted at the read operation to the data bus DB through the column switch, and is written at the write operation in the memory cell MC through the bit lines.

The precharging circuit unit PRE has a plurality of precharge circuits. The precharge circuit responds to the high-level period of the bit line resetting signal BRS which is outputted after execution of any of the read operation, the write operation and the refresh operation, and executes the precharge operation to precharge the bit lines BL and /BL to the predetermined voltage.

The sense buffer unit SB amplifies the signal amount of the read data on the data bus DB, and outputs it to the common data bus CDB. The write amplifier unit WA amplifies the signal amount of the write data on the common data bus CDB, and outputs it to the data bus DB.

Figure 2:
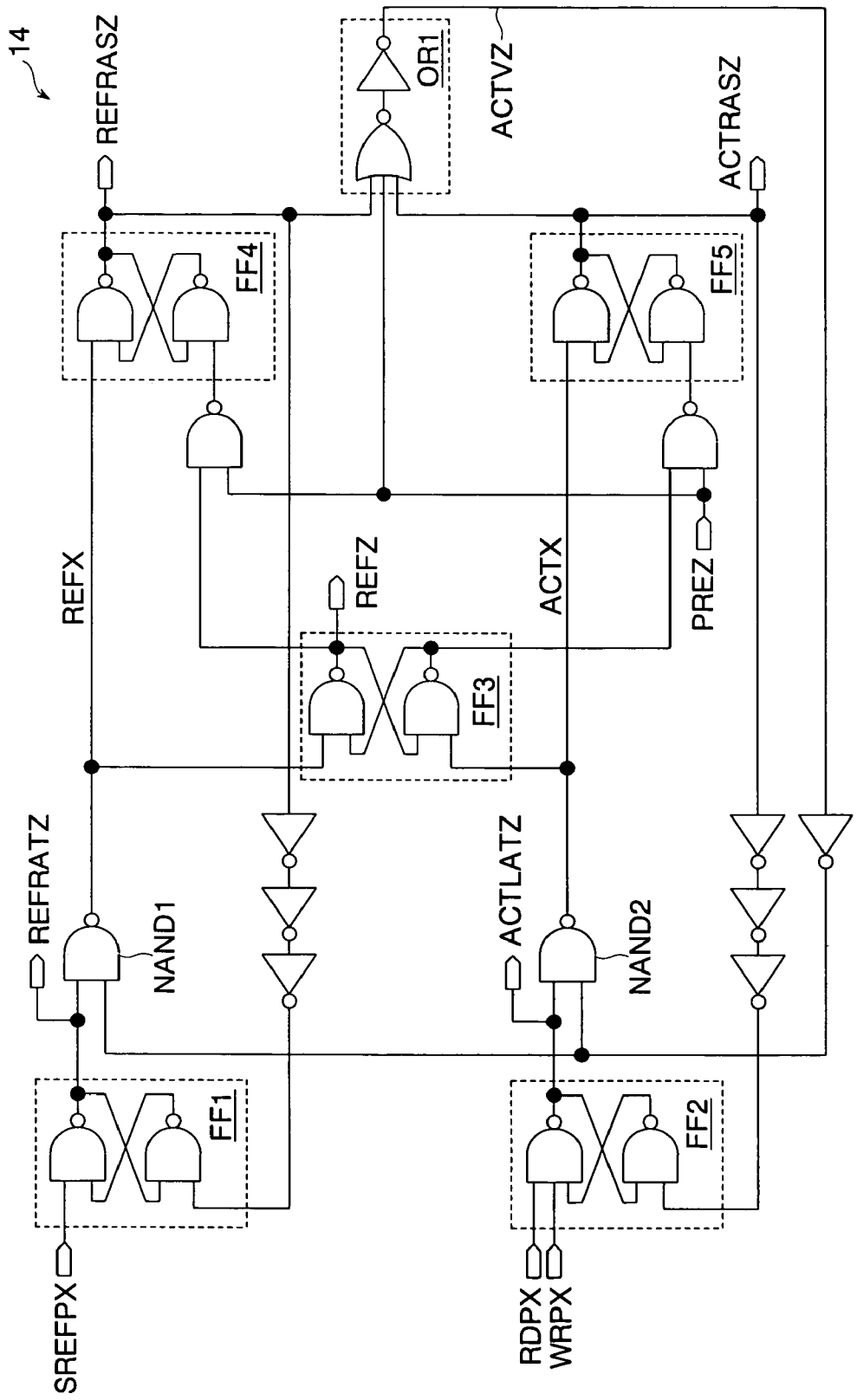
FIG. 2 is a circuit diagram showing the detail of an arbiter shown in FIG. 1.

FIG. 2 shows the detail of the arbiter 14 shown in FIG. 1. The arbiter 14 includes a flip-flop FF1-FF5, NAND gates NAND1 and NAND2, an OR circuit OR1, and a plurality of logic gates connected with those circuits. The flip-flop FF1 activates refresh latch signal REFLATZ in response to the activation of the refresh request signal SREFPX, and deactivates the refresh latch signal REFLATZ in response to the activation of the refresh timing signal REFRASZ. In short, the flip-flop FF1 retains the refresh request as the refresh latch signal REFLATZ till the refresh operation is executed.

The flip-flop FF2 activates the access latch signal ACTLATZ in response to the activation of the read request signal RDPX or the write request signal WRPX, and deactivates the access latch signal ACTLATZ in response to the activation of the access timing signal ACTRASZ. In short, the flip-flop FF2 retains the access request as the access latch signal ACTLATZ till the access operation is executed. The flip-flops FF1 and FF2 are reset by themselves.

The NAND gate NAND1 transmits a refresh signal REFX, as inverted from a refresh latch signal REFRATZ, to the flip-flop FF4 while an active signal ACTVZ is at a low level (while the memory core 40 is non-operative). The NAND gate NAND2 transmits the access signal ACTX, as inverted from the access latch signal ACTLATZ, to the flip-flop FF5 while the active signal ACTVZ is at the low level.

The flip-flop FF3 changes, in response to the activation of the refresh signal REFX, the refresh signal REFZ to the high level, and changes, in response to the activation of the access signal ACTX, the refresh signal REFZ to the low level.

The flip-flop FF4 activates the refresh timing signal REFRASZ in response to the activation (or the low level) of the refresh signal REFX, and deactivates the same in response to the activation of the precharge timing signal PREZ corresponding to the refresh operation. The refresh timing signal REFRASZ is a signal for deciding the activation period of the word lines WL at the refresh operation time.

The flip-flop FF5 activates the access timing signal ACTRASZ in response to the activation (or the low level) of the access signal ACTX, and deactivates the access timing signal ACTRASZ in response to the activation of the precharge timing signal PREZ corresponding to the access operation. The access timing signal ACTRASZ is a signal for deciding the activation period of the word lines WL at the access operation.

The OR circuit OR1 outputs the active signal ACTVZ at the high level, when any of the refresh timing signal REFRASZ, the access timing signal ACTRASZ and the precharge timing signal PREZ is activated. The activation period of the active signal ACTVZ is the sum of the activation period of the refresh timing signal REFRASZ or the access timing signal ACTRASZ, and the activation period of the precharge timing signal PREZ, and indicates the active period of the memory core 40 in the refresh operation or the access operation.

Figure 3:
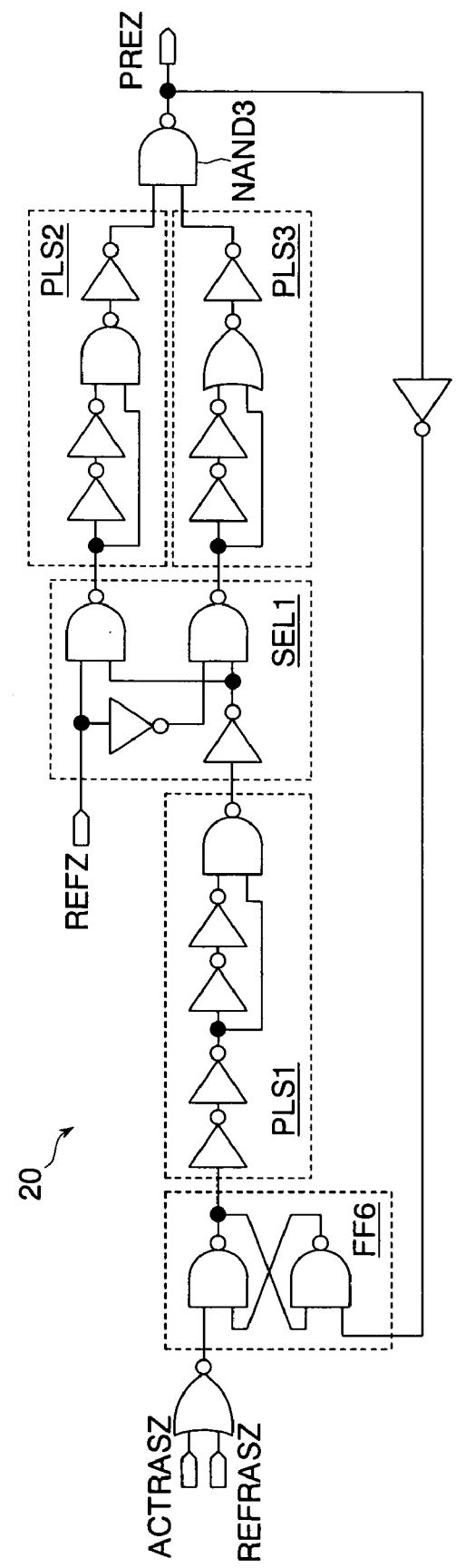
FIG. 3 is a circuit diagram showing the detail of a PREZ generating circuit shown in FIG. 1.

FIG. 3 shows the detail of the PREZ generating circuit 20 shown in FIG. 1. This PREZ generating circuit 20 includes a flip-flop FF6, pulse generating circuits PLS1 to PLS3, a sector SEL1, a NAND gate NAND3, and a plurality of logic gates connected with those circuits. The flip-flop FF6 is set in synchronization with the activation of the access timing signal ACTRASZ or the refresh timing signal REFRASZ, and is reset in synchronism with the precharge timing signal PREZ. The pulse generating circuit PLS1 outputs low-level pulses a predetermined time after the response to the setting of the flip-flop FF6.

The selector SEL1 transmits the low-level pulses generated by the pulse generating circuit PLS1, to the pulse generating circuit PLS2 when the refresh signal REFZ is at the high level, and to the pulse generating circuit PLS3 when the refresh signal REFZ is at the low level. The pulse generating circuit PLS2 (or the first pulse generating circuit) generates the negative pulses, for which the low-level period (or the pulse width) of the low-level pulses is elongated. The pulse generating circuit PLS3 (or the second pulse generating circuit) delays the low-level pulses by a predetermined time period, and generates negative pulses of the short low-level period (or the pulse width).

The NAND gate NAND3 inverts the negative pulses outputted from the pulse generating circuits PLS2 and PLS3, and outputs them as the precharge timing signals PREZ (i.e., the first precharge timing signal and the second precharge timing signal). The selector SEL1 and the NAND gate NAND3 operate as selecting circuits for selecting the pulse generating circuits PLS2 and PLS3 to be employed for generating the precharge timing signal PREZ.

The precharge timing signal PREZ, which is generated in response to the refresh timing signal REFRASZ by the pulse generating circuits PLS2 and PLS3, has a long high-level period (or a precharge time period: the later-described time period P1 of FIG. 7), and the precharge timing signal PREZ, which is generated in response to the access timing signal ACTRASZ, has a short high-level period (or a precharge time period: the time period P2 of FIG. 7). On the other hand, the time period (D1 of FIG. 7) from the activation of the refresh timing signal REFRASZ to the activation of the precharge timing signal PREZ is shorter than the time period (D2 of FIG. 7) from the activation of the access timing signal ACTRASZ to the activation of the precharge timing signal PREZ. The time periods D1 and D2 indicate the operation time periods of the memory core 40. In other words, the operation time period of the memory core 40 by the refresh operation is set shorter than the operation time period of the memory core 40 by the access operations.

Figure 4:
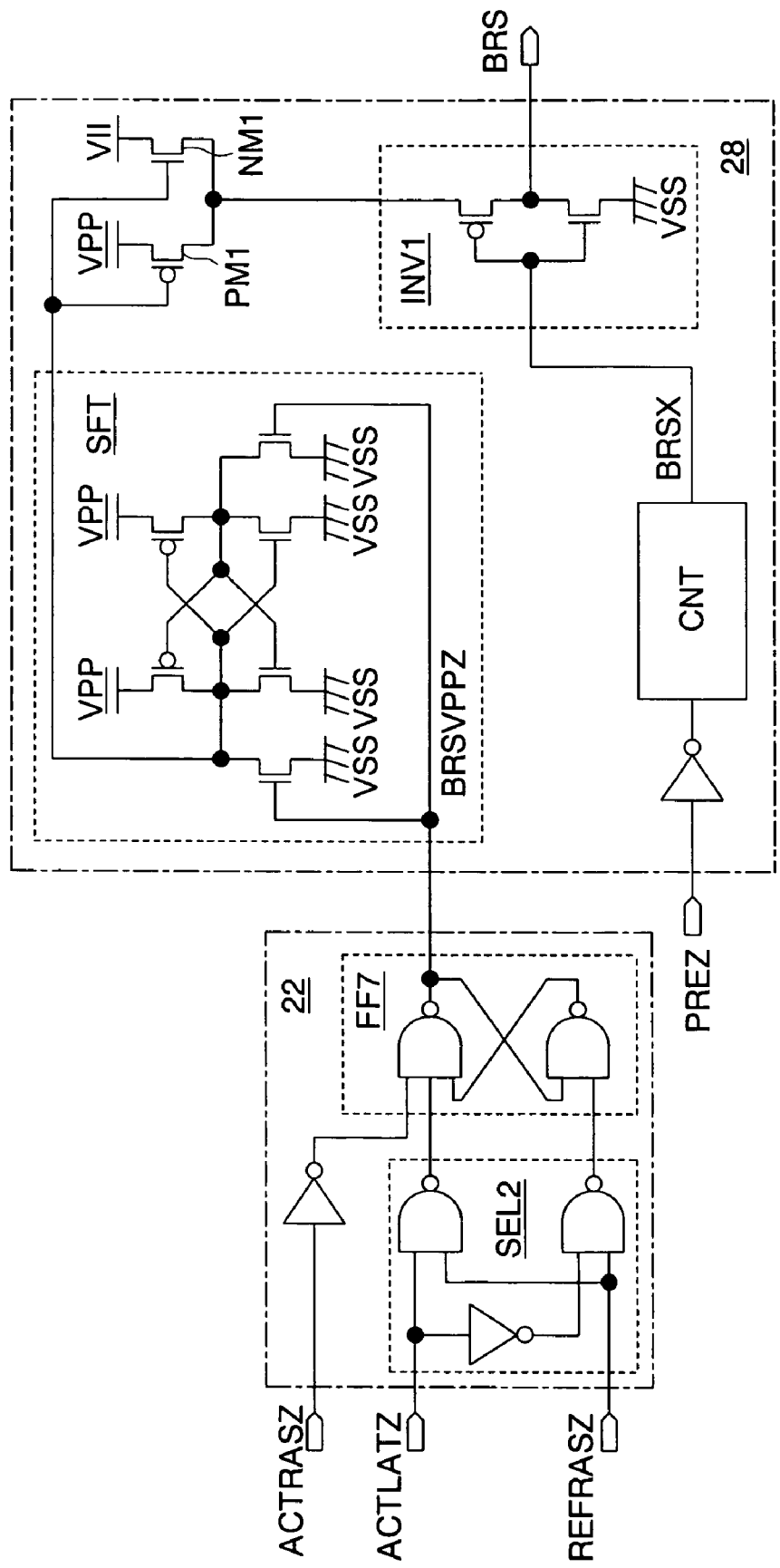
FIG. 4 is a circuit diagram showing the details of a BRS-VPPZ generating circuit and a BRS generating circuit shown in FIG. 1.

FIG. 4 shows the details of the BRSVPPZ generating circuit 22 (or the switch control circuit) and the BRS generating circuit 28 shown in FIG. 1. The BRSVPPZ generating circuit 22 includes a selector SEL2, a flip-flop FF7 and a plurality of logic gates connected with those circuits. The selector SEL2 transmits the refresh timing signal REFRASZ to the set terminal of the flip-flop FF7, when the access latch signal ACTLATZ is at the high level, and transmits the refresh timing signal REFRASZ to the reset terminal of the flip-flop FF7 when the access latch signal ACTLATZ is at the low level. The flip-flop FF7 has two set terminals and changes the BRS setting signal BRSVPPZ to the high level when the access timing signal ACTRASZ and the refresh timing signal REFRASZ are individually activated. Moreover, the flip-flop FF7 changes the BRS setting signal BRSVPPZ to the low level in synchronization of the activation of the refresh timing signal REFRASZ.

The BRS generating circuit 28 includes a level shifter SFT, a pMOS transistor TM1 having its source connected with the boost power supply line VPP, an nMOS transistor NM1 having its drain connected with the internal power supply line VII, a control circuit CNT and a CMOS inverter INV1. The level shifter SFT has a latch composed of two CMOS inverters, in which the sources of pMOS transistors are connected with the boost power supply line VPP, so that a low-level voltage (VSS) of the BRS setting signal BRSVPPZ is converted into the boost voltage VPP.

The pMOS transistor PM1 receives the output (or the switch control signal) of the level shifter SFT at its gate, and is turned ON, when the BRS setting signal BRSVPPZ is at the high level, to supply the boost voltage VPP to the source of the pMOS transistor of the inverter INV1. The nMOS transistor NM1 receives the output of the level shifter SFT at its gate, and is turned ON, when the BRS setting signal BRSVPPZ is at the low level, to supply the internal supply voltage VII to the source of the pMOS transistor of the inverter INV1. The pMOS transistor PM1 and the nMOS transistor NM1 operate as the switch circuit for outputting the boost voltage VPP or the internal supply voltage VII to a CMOS inverter INV in response to the BRS setting signal BRSVPPZ.

The control circuit CNT generates a bit line resetting signal BRSX in response to the precharge timing signal PREZ. When the memory core 40 is in the standby state, that is, in case the access request is not supplied to the pseudo-SRAM, the control circuit CNT outputs the bit line resetting signal BRSX of the low level independently of the logic level of the precharge timing signal PREZ, so that the bit lines BL and /BL may be retained in the precharge state.

The CMOS inverter INV1 inverts and outputs the bit line resetting signal BRSX as the bit line resetting signal BRS. The high-level voltage of the bit line resetting signal BRS is set to the boost voltage VPP, when the BRS setting signal BRSVPPZ is at the high level, and to the internal supply voltage VII when the BRS setting signal BRSVPPZ is at the low level. The control circuit CNT and the inverter INV1 operate as signal generating circuits for generating the bit line resetting signal BRS and for setting the high-level voltage of the bit line resetting signal BRS to the boost voltage VPP or the internal supply voltage VII.

Figure 5:
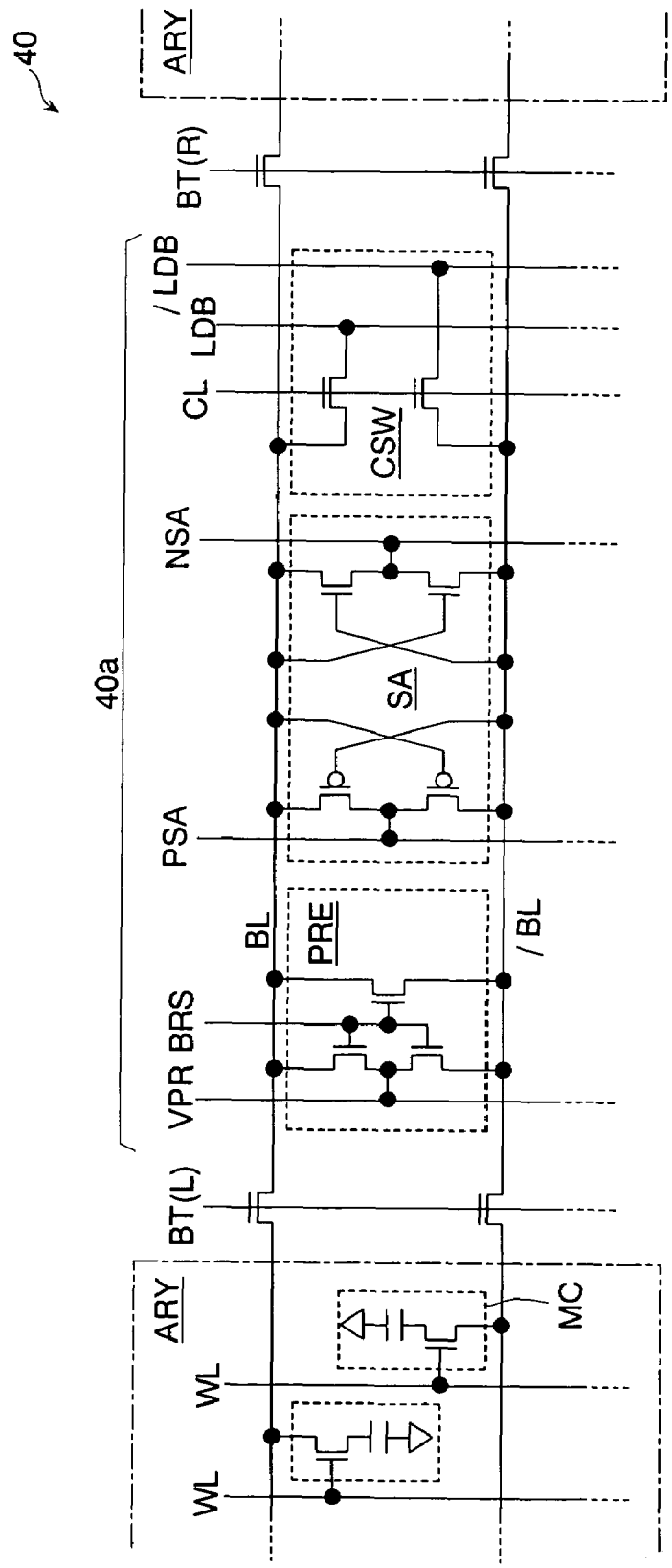
FIG. 5 is a circuit diagram showing the detail of an essential portion of a memory core shown in FIG. 1.

FIG. 5 shows the detail of the essential portion of the memory core 40 shown in FIG. 1. In this embodiment, an access control circuit 40a, as composed of the precharge circuit PRE, the sense amplifier SA and a column switch CSW, is shared between the two adjacent memory arrays ARY. The memory arrays ARY are connected with the access control circuit 40a through the bit line controlling switch (or the nMOS transistor) controlled by bit line controlling signals BT(L) and BT(R).

The precharge circuit PRE is composed of one pair of nMOS transistors for connecting the complementary bit lines BL and /BL individually with a precharge voltage line VPR (VII/2), and an nMOS transistor for connecting the bit lines BL and /BL with each other. The gate of the nMOS transistors of the precharge circuit PRE receives the bit line reset signal BRS. When the bit line resetting signal BRS is set at the boost voltage VPP, the gate-to-source voltage of the nMOS transistor rises (VPP−VII/2) to reduce the ON resistance so that the bit lines BL and /BL are precharged for a short time period. When the bit line resetting signal BRS is set at the internal supply voltage VII, the gate-to-source voltage of the nMOS transistor is lower (VII/2) to raise the ON resistance so that the bit lines BL and /BL are precharged for a long time.

The sense amplifier SA is constituted of a latch circuit, in which the power supply terminals are individually connected with the signal lines of the sense amplifier activating signals PSA and NSA. The signal lines of the sense amplifier activating signals PSA and NSA are individually connected with the sources of the pMOS transistor and the nMOS transistor constituting the latch circuit. The column switch CSW is constituted of an nMOS transistor connecting the bit line BL and a local data bus line LDB, and an nMOS transistor for connecting the bit line /BL and a local data bus line /LDB. The gate of each nMOS transistor receives a column line signal CL generated at the column decoder unit CDEC.

Figure 6:
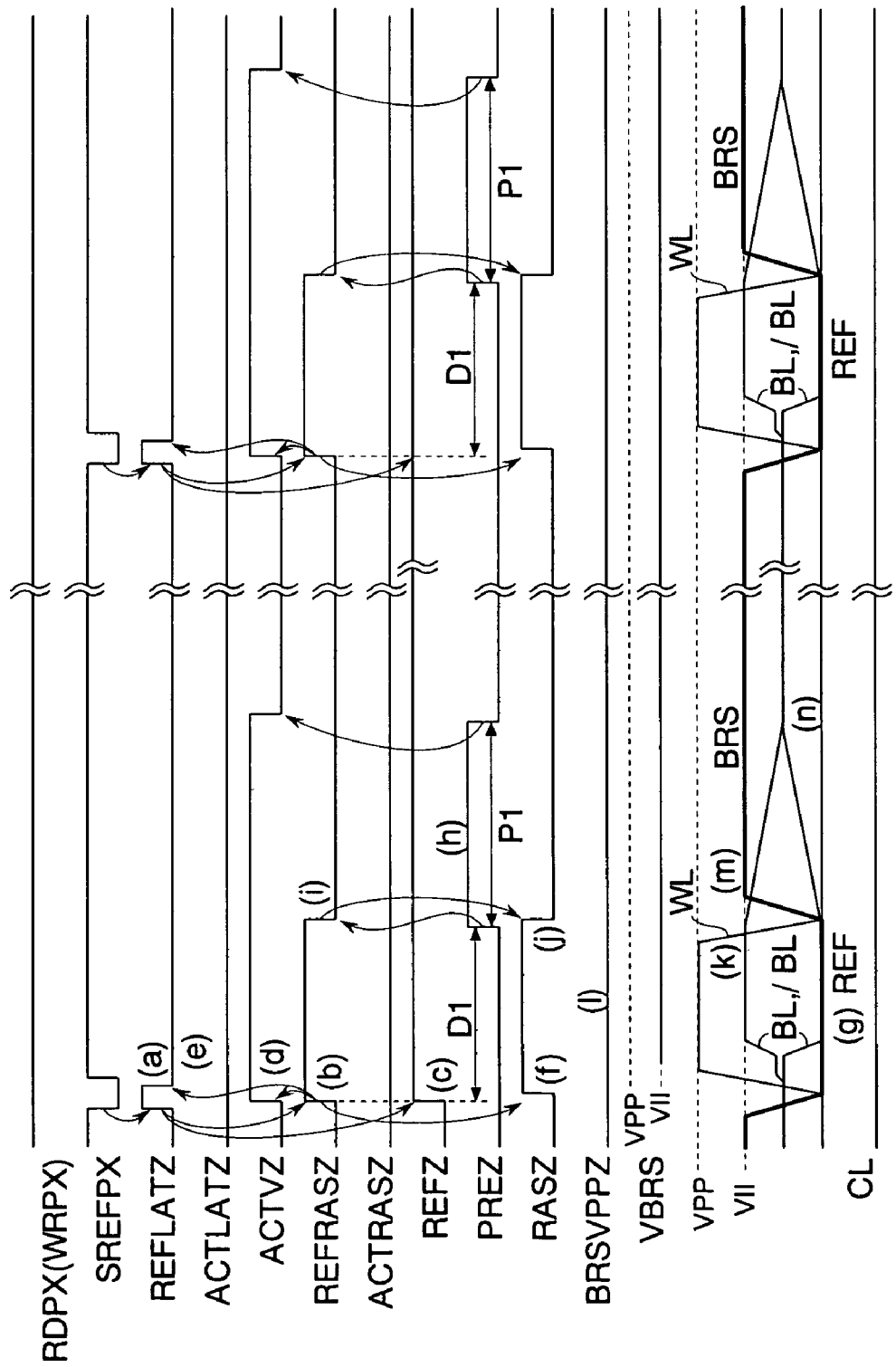
FIG. 6 is a timing chart showing the standby operations of a pseudo-SRAM in the first embodiment.

FIG. 6 shows the operations of the pseudo-SRAM in the first embodiment for the standby period. For this standby period, the access request (RDPX, WRPX) from the outside of the pseudo-SRAM is not supplied, and the memory core 40 executes a refresh operation REF only when the refresh request (SREFPX) occurs.

The arbiter 14 shown in FIG. 2 is synchronized with the refresh request signal SREFPX to activate refresh latch signal REFRATZ, the refresh timing signal REFRASZ and refresh signal REFZ (FIG. 6(a, b, c)). The arbiter 14 activates the active signal ACTVZ and deactivates the refresh latch signal REFRATZ in synchronism with the activation of the refresh timing signal REFRASZ (FIG. 6(d, e)). The row operation control circuit 16 activates the row timing signal RASZ in synchronism with the refresh timing signal REFRASZ (FIG. 6(f)). In response to the refresh address signal REFAD, moreover, the word line WL is selected, and the sense amplifier SA is activated to start the refresh operation REF (FIG. 6(g)).

In response to the refresh signal REFZ at the high level, the selector SEL1 of the PREZ generating circuit 20 shown in FIG. 3 selects the route containing the pulse generating circuit PLS2. As a result, the precharge timing signal PREZ is activated only for the period P1 (or the first pulse width) the D1 time after the activation of the refresh timing signal REFRASZ (FIG. 6(h)). In response to the activation of the precharge timing signal PREZ, the arbiter 14 deactivates the refresh timing signal REFRASZ (FIG. 6(i)). In response to the deactivation of the refresh timing signal REFRASZ, the row timing signal RASZ is deactivated (FIG. 6(j)), and the word line WL is unselected (FIG. 6(k)).

The BRSVPPZ generating circuit 22 shown in FIG. 4 receives only the activation of the refresh timing signal REFRASZ so that it retains a BRS setting VPPZ at a low level (FIG. 6(l)). As a result, the BRS generating circuit 28 employs the internal supply voltage VII as a high level voltage VBRS of the bit line resetting signal BRS. In response to the activation of the precharge timing signal PREZ, the BRS generating circuit 28 changes the bit line resetting signal BRS into the internal supply voltage VII (FIG. 6(m)). In response to the bit line resetting signal BRS at the high level, the precharge circuit PRE, as shown in FIG. 5, connects the bit lines BL and /BL with the precharge voltage line VPR (VII/2). In short, the precharge operation is executed.

At this time, the gate-to-source voltage of the nMOS transistor of the precharge circuit PRE is so low that the bit lines BL and /BL are precharged (FIG. 6(n)) for a long time period corresponding to the activation period P1 of the precharge timing signal PREZ. Since the generating cycle of the refresh request signal SREFPX is generally several tens microseconds, the circuit operates without any problem even if the precharge time period after the refresh operation REF is elongated for the standby period. By setting the high-level voltage VBRS of the bit line resetting signal BRS not at the boost voltage VPP but at the internal supply voltage VII, the use of the boost voltage VPP for the standby period can be minimized. As a result, the current consumption of the VPP generating circuit 26 can be suppressed to reduce the standby current. When the refresh timer 12 outputs the refresh request signal SREFPX again, the refresh operation REF is executed like before.

Figure 7:
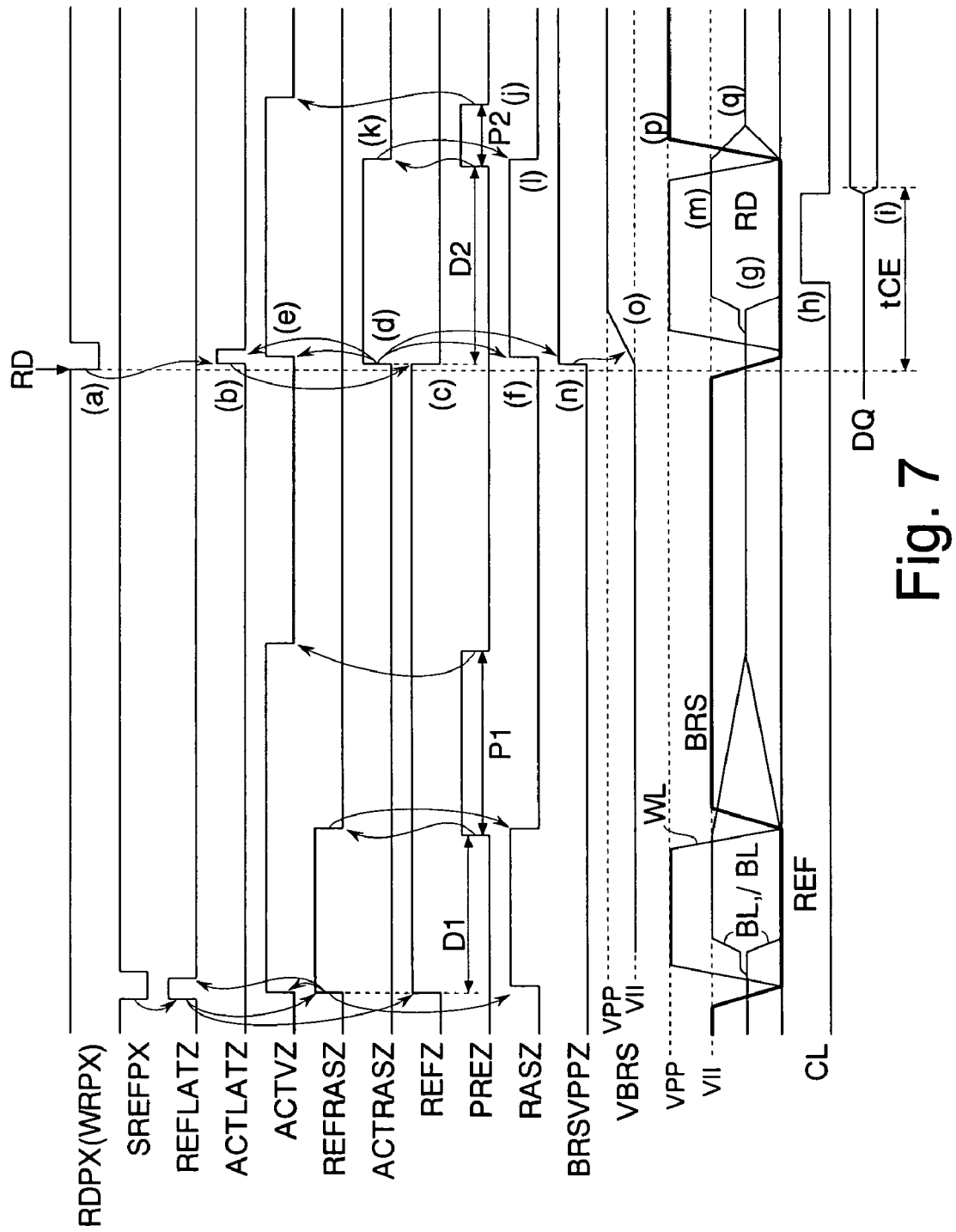
FIG. 7 is a timing chart showing an example of the first embodiment, in which a read operation is executed after a refresh operation is executed.

FIG. 7 shows an example of the first embodiment, in which a read operation RD is executed after the refresh operation REF is executed. The read command RD (or an access request) is supplied (FIG. 7(a)) after the completion of the refresh operation REF. In this example, no conflict occurs between the refresh request and the access request. The refresh operation REF responding to the refresh request signal SREFPX is executed as has been described in FIG. 6, and its description is omitted.

The arbiter 14, as shown in FIG. 2, activates the access latch signal ACTLATZ in synchronism with the read request signal RDPX (FIG. 7(b)). Since the active signal ACTVZ is at the low level, the arbiter 14 is synchronized with the access latch signal ACTLATZ to deactivate the refresh latch signal REFZ (FIG. 7(c)), to activate the access timing signal ACTRASZ (FIG. 7(d)), and to activate the active signal ACTVZ (FIG. 7(e)). The row operation control circuit 16 is synchronized with the access timing signal ACTRASZ to activate the row timing signal RASZ (FIG. 7(f)). Then, the word line WL is selected in response to the refresh address signal REFAD, and the sense amplifier SA is activated so that the read operation RD is started (FIG. 7(g)). While the word line WL is being selected, the column line signal CL responding to the column address signal CAD is selected (FIG. 7(h)), and the signal amplified by the sense amplifier SA is transmitted as read data to the data bus. The read data is latched and is then outputted through the data terminal DQ to the outside of the pseudo-SRAM (FIG. 7(i)). The operation from the read command RD to the output of the read data is defined as an external command access time tCE.

In response to the refresh signal REFZ at the low level, the selector SEL1 of the PREZ generating circuit 20, as shown in FIG. 3, selects the route containing the pulse generating circuit PLS1. As a result, the precharge timing signal PREZ is activated only for the period P2 (or the second pulse width) at the time D2 after the activation of the access timing signal ACTRASZ (FIG. 7(j)). In response to the activation of the precharge timing signal PREZ, the arbiter 14 deactivates the access timing signal ACTRASZ (FIG. 7(k)). When the access timing signal ACTRASZ is deactivated, the row timing signal RASZ is deactivated (FIG. 7(*l*)), and the word line WL is unselected (FIG. 7(*m*)).

In response to the access timing signal ACTRASZ, the BRSVPPZ generating circuit 22, as shown in FIG. 4, changes the BRS setting signal BRSVPPZ from the low level to the high level (FIG. 7(*n*)). As a result, the BRS generating circuit 28 sets the high-level voltage VBRS of the bit line resetting signal BRS to the boost voltage VPP (FIG. 7(*o*)). In response to the activation of the precharge timing signal PREZ, the BRS generating circuit 28 changes the bit line resetting signal BRS to the boost voltage VPP (FIG. 7(*p*)). In response to the bit line resetting signal BRS at the high level, the precharge circuit PRE, as shown in FIG. 5, connects the bit lines BL and /BL with the precharge voltage line VPR (VII/2). In short, the precharge operation is executed.

At this time, the gate-to-source voltage of the nMOS transistor of the precharge circuit PRE is so high that the bit lines BL and /BL are precharged (FIG. 7(*q*)) for a short time period corresponding to the activation period P2 of the precharge timing signal PREZ. Thus, the high-level voltage VBRS of the bit line resetting signal BRS is changed during the precharge operations after the refresh operation REF and after the read operation RD (or after the access operation), so that the current consumption (or the standby current) during the standby period can be reduced without influencing the read cycle time period (tRC of FIG. 8).

Figure 8:
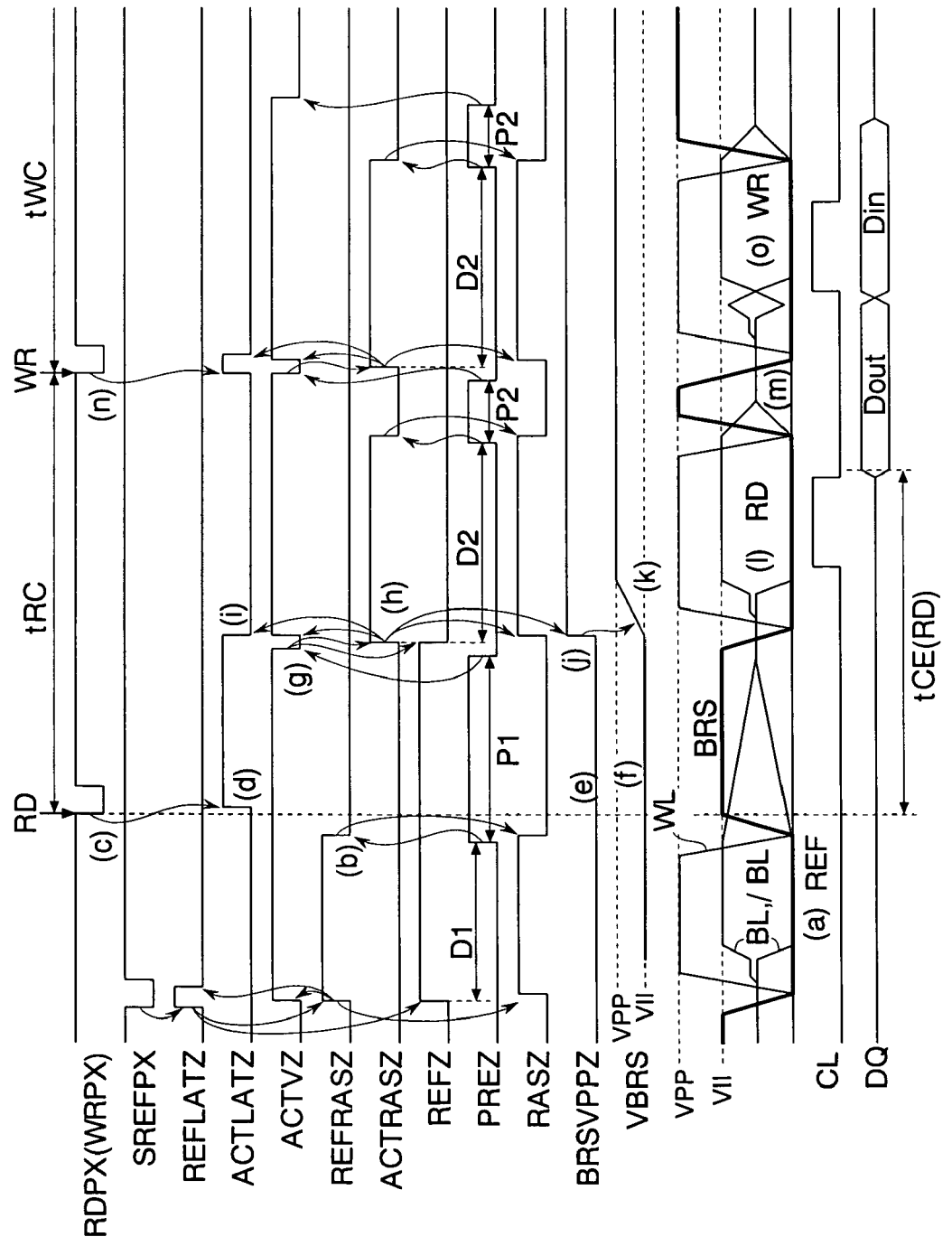
FIG. 8 is a timing chart showing an example of the first embodiment, in which a read command is supplied during a refresh operation and in which a write command is then supplied.

FIG. 8 shows an example of the first embodiment, in which the read command RD is supplied during the refresh operation REF (or the rewrite operation excepting the precharge period) and in which a write command WR is then supplied. The detailed description on the same operations as those of FIG. 6 and FIG. 7 is omitted. The pseudo-SRAM does not accept an access request when it accepts the refresh request (SREFPX), so that it starts the refresh operation REF (FIG. 8(*a*)) like FIG. 7.

The read command RD is supplied (FIG. 8(*b, c*)) after the refresh timing signal REFRASZ indicating the activation period of the word line WL in the refresh operation REF is deactivated. More specifically, the access latch signal ACTLATZ, as generated in response to the read command RD (RDPX), is activated (FIG. 8(*d*)) after the refresh timing signal REFRASZ is deactivated. As a result, the selector SEL2 of the BRSVPPZ generating circuit 22 shown in FIG. 4 does not set the flip-flop FF7.

The BRS setting signal BRSVPPZ is retained at the low level (VSS) (FIG. 8(*e*)), and the high-level voltage VBRS of the bit line resetting signal BRS is continuously set at the internal supply voltage VII (FIG. 8(*f*)). In the precharge operation after the refresh operation REF, therefore, the bit line resetting signal BRS is set at the internal supply voltage VII. In other words, the precharge operation is executed for the long time P1, as in FIG. 6 and FIG. 7. In other words, in case the external command access time tCE from the supply of the read command RD to the start of the output of the read data to the data terminal DQ and the read cycle time tRC satisfy the product specifications, the bit line resetting signal BRS can be set to the internal supply voltage VII.

In response to the deactivation (or the completion of the precharge operation) of the precharge timing signal PREZ, the arbiter 14 deactivates the active signal ACTVZ but activates the access timing signal ACTRASZ (FIG. 8(*g, h*)). When the access timing signal ACTRASZ is activated, the access latch signal ACTLATZ is deactivated (FIG. 8(*i*)).

In response to the activation of the access timing signal ACTRASZ, the selector SEL2 of the BRSVPPZ generating circuit 22 sets the flip-flop FF7, and changes the BRS setting signal BRSVPPZ to the high level (FIG. 8(*j*)). As a result, the BRS generating circuit 28 switches the high-level voltage VBRS of the bit line resetting signal BRS from the internal supply voltage VII to the boost voltage VPP (FIG. 8(*k*)).

Thereafter, as in FIG. 7, the read operation RD and the precharge operation following the read operation RD are executed (FIG. 8(*l, m*)). The high-level voltage VBRS of the bit line resetting signal BRS is set at the boost voltage VPP, so that the gate-to-source voltage of the nMOS transistor of the precharge circuit PRE rises. As a result, the precharge operation is executed for the short time period P2.

After this, the write command WR (WRPX) is supplied after the predetermined read cycle time tRC (FIG. 8(*n*)). The pseudo-SRAM operates at the same timing as the read operation RD shown in FIG. 7, and the write operation WR is completed within a write cycle time tWC (FIG. 8(*o*)). In the write operation WR, the write data is supplied, just after the sense amplifier SA is activated, to the bit lines BL and /BL through the data bus line.

Figure 9:
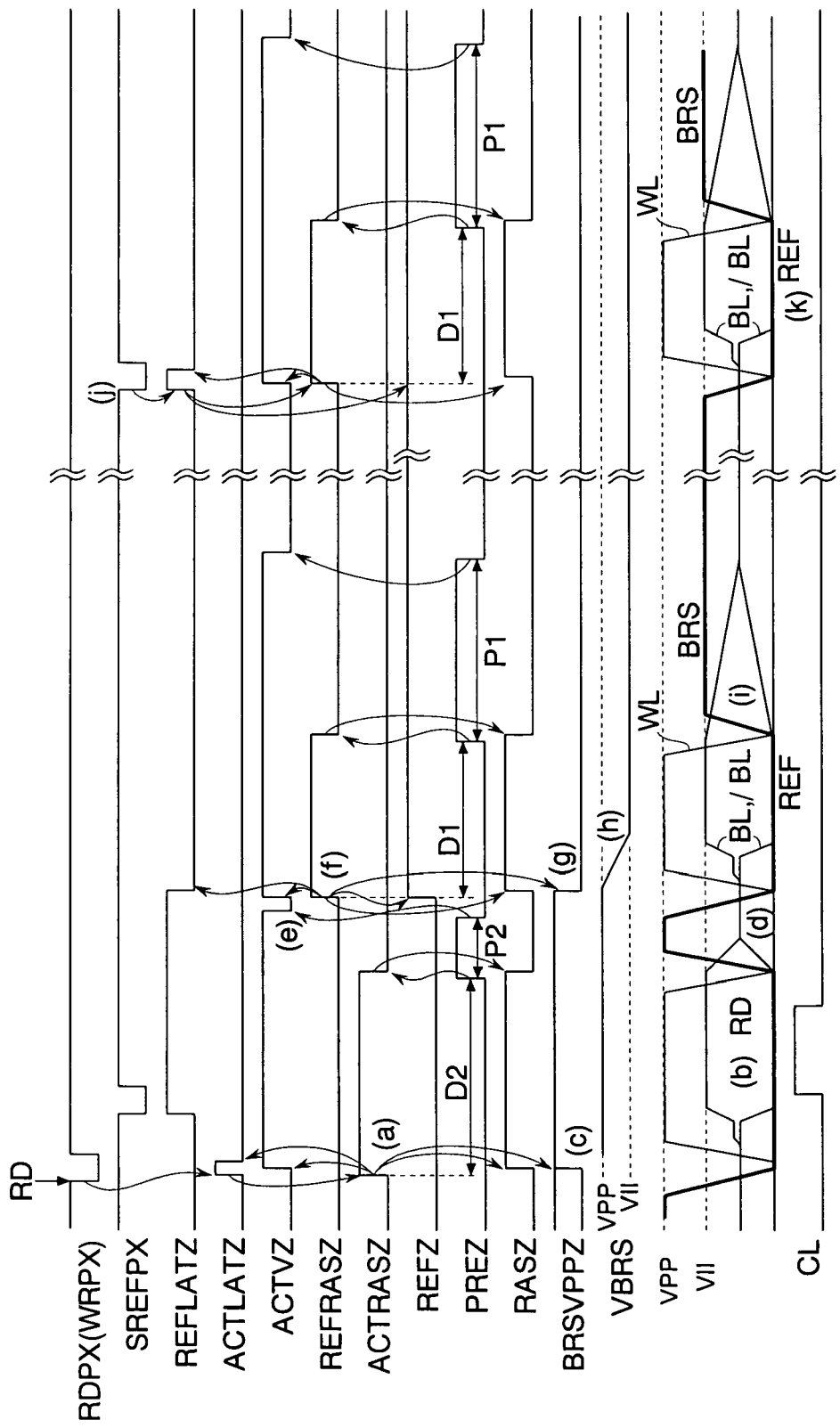
FIG. 9 is a timing chart showing an example of the first embodiment, in which a refresh request occurs immediately after a read request.

FIG. 9 shows an example of the first embodiment, in which a refresh request is made just after the read request. The arbiter 14 accepts the read command RD (RDPX) prior to the refresh request (SREFPX), and activates the access timing signal ACTRASZ (FIG. 9(*a*)). As a result, the read operation RD is executed prior to the refresh operation REF (FIG. 9(*b*)). In response to the activation of the access timing signal ACTRASZ, the BRSVPPZ generating circuit 22 retains the BRS setting signal BRSVPPZ at the high level (FIG. 9(*c*)). As a result, the high-level voltage VBRS of the bit line resetting signal BRS is set at the boost voltage VPP so that the precharge operation is executed for the short time period P2 (FIG. 9(*d*)).

In response to the deactivation of the precharge timing signal PREZ, the arbiter 14 deactivates the active signal ACTVZ (FIG. 9(*e*)). In response to the deactivation of the active signal ACTVZ, the refresh timing signal REFRASZ is activated (FIG. 9(*f*)). In response to the activation of the refresh timing signal REFRASZ during the inactive period of the access latch signal ACTLATZ, the BRSVPPZ generating circuit 22 changes the BRS setting signal BRSVPPZ from the high level to the low level (FIG. 9(*g*)). The high-level voltage VBRS is switched after the precharge operation following the read operation RD is completed to enter the refresh operation period. Similarly to the aforementioned FIG. 8, the charge of the boost voltage line VPP can be prevented from flowing into the internal supply voltage line VII so that the internal supply voltage VII can be prevented from fluctuating.

The BRSVPPZ generating circuit 22 receives the BRS setting signal BRSVPPZ at the low level, and sets the high-level voltage VBRS of the bit line resetting signal BRS to the internal supply voltage VII (FIG. 9(*h*)). As a result, the precharge operation after the refresh operation REF is executed for the long time period P1 (FIG. 9(*i*)). The high-level voltage VBRS is switched after the precharge operation following the read operation RD is completed to enter the refresh operation period, that is, the high-level voltage VBRS is switched after the bit line resetting signal BRS is set to the ground voltage VSS (for the non-precharge period), the charge of the boost voltage line VPP can be prevented from being injected into the internal supply voltage line VII so that the internal supply voltage VII can be prevented from fluctuating.

When the refresh request (SREFPX) then occurs during the standby period, the refresh operation REF is executed (FIG. 9(*j, k*)) as in FIG. 6. The high-level voltage VBRS of the bit line resetting signal BRS is continuously set at the internal supply voltage VII till the access command is supplied.

Figure 10:
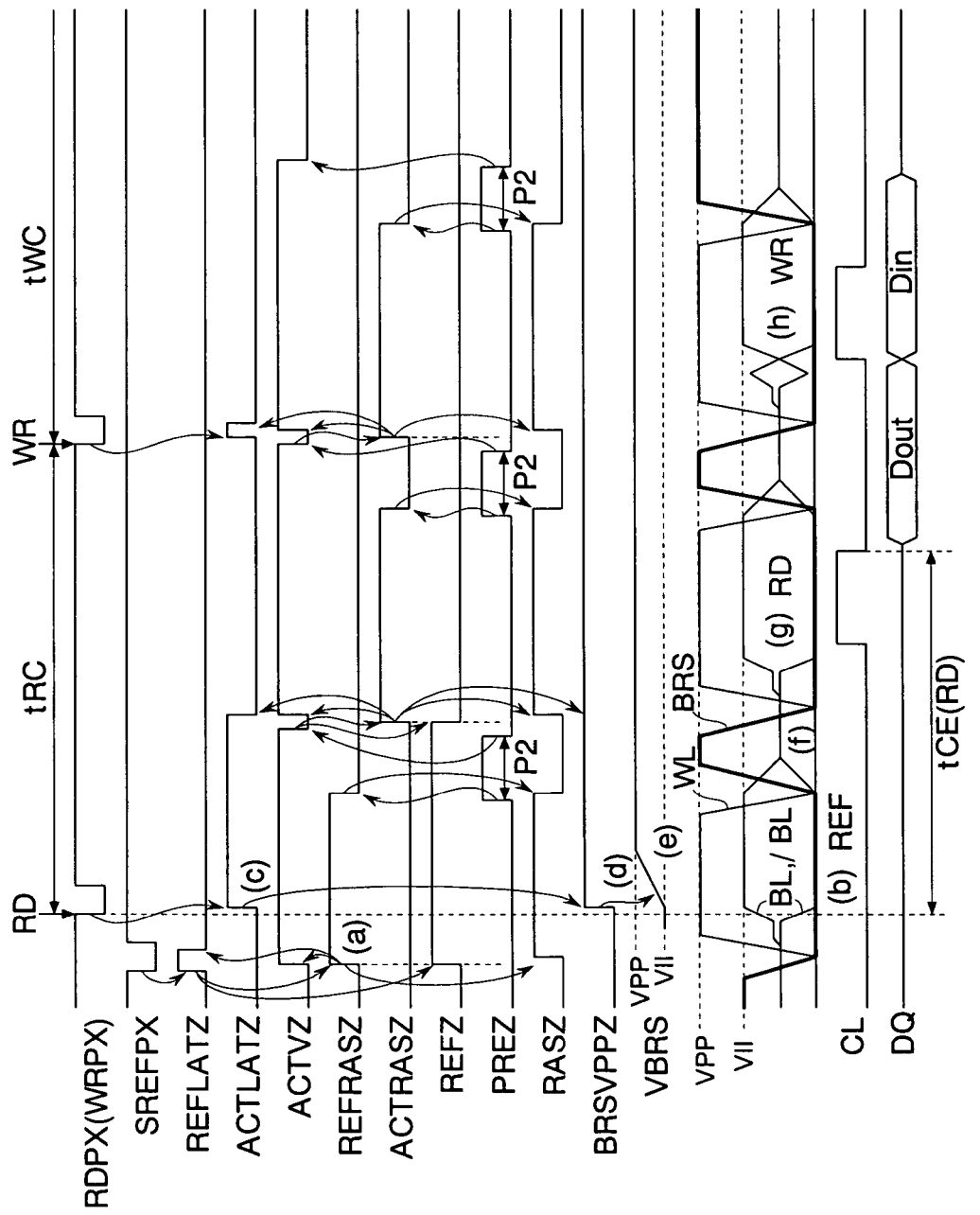
FIG. 10 is a timing chart showing an example of the first embodiment, in which a read request occurs immediately after a refresh request.

FIG. 10 shows an example of the first embodiment, in which the read request occurs just after the refresh request. More specifically, the read request is supplied during the refresh operation REF. The arbiter 14 accepts the refresh request (SREFPX) prior to the read command RD (RDPX), and activates the refresh timing signal REFRASZ (FIG. 10(a)). As in FIG. 7, therefore, the refresh operation REF is executed prior to the read operation RD (FIG. 10(b)). In this example, however, the precharge operation following the refresh operation REF is different from that of FIG. 7.

In response to the read request signal RDPX, the arbiter 14 activates the access latch signal ACTLATZ (FIG. 10(c)). In response to the activation of the access latch signal ACTLATZ during the activation period of the refresh timing signal REFRASZ, the BRSVPPZ generating circuit 22 changes the BRS setting signal BRSVPPZ from the low level to the high level (FIG. 10(d)). In response to the BRS setting signal BRSVPPZ of the high level, the BRSVPPZ generating circuit 22 sets the high-level voltage VBRS of the bit line resetting signal BRS to the boost voltage VPP (FIG. 10(e)). As a result, the precharge operation after the refresh operation REF is executed for the short time period P2 (FIG. 10(f)). Thus, in case the access request occurs just after the refresh request, the precharge operation after the refresh operation REF is executed for the short time period so that the read cycle time tRC or the minimum supply interval of the read command RD and the external command access time tCE can be shortened. Similar discussion applies to the write command WR.

After this, as in FIG. 7 and FIG. 8, the read operation RD and the write operation WR responding to the read command RD and the write command WR are executed (FIG. 10(g, h)).

In this embodiment, the voltage of the bit line resetting signal BRS is set to the internal supply voltage VII during the precharge operation following the refresh operation, and is set to the boost voltage VPP during the precharge operation following the access operation. During the precharge operation following the refresh operation, the boost voltage VPP is not used so that the current consumption of the VPP generating circuit 26 can be reduced to reduce the standby current of the pseudo-SRAM for the standby period. By employing the internal supply voltage VII during the precharge operation, the precharge operation time is relatively elongated. In the pseudo-SRAM, however, only the refresh operation is executed for the standby period, so that no problem occurs even if the precharge operation time is long. The high-level voltage VBRS of the bit line resetting signal BRS is set to the internal supply voltage VII in response to the first internal refresh request SREFPX after the access operation, and is set to the boost voltage VPP in response to the first access request RDPX (or WRPX) after the refresh operation. As a result, the high-level voltage VBRS can be sufficiently set to the predetermined value before the precharge operation is started. As a result, it is easy to design the circuit and timing of the pseudo-SRAM.

The high-level voltage VBRS is switched when the bit line resetting signal BRS is in the period of the low-logic level (or the non-precharge period). As a result, the charge of the boost voltage VPP supplied to the signal line of the bit line resetting signal BRS can be prevented from being injected into the internal supply voltage line VII at the time of switching. As a result, the internal supply voltage VII can be prevented from fluctuating thereby to operate the pseudo-SRAM stably.

The high-level voltage VBRS is set to the internal supply voltage VII in response to the refresh control signal REFRASZ for starting the refresh operation and to the boost voltage VPP in response to the access control signal ACTRASZ. As a result, the bit line resetting signal BRS can be sufficiently set to the internal supply voltage VII or the boost voltage VPP before the precharge operation.

The high-level voltage VBRS is switched, when the access request RDPX (or WRPX) is supplied during refresh operation, from the internal supply voltage VII to the boost voltage VPP in response to that access request. As a result, the voltage of the bit line resetting signal BRS during the precharge operation following the refresh operation is exceptionally set to the boost voltage VPP. Therefore, the precharge operation time can be shortened to start the access operation early subsequent to the refresh operation. As a result, it is possible to shorten the access cycle times tRC and tWC and the external command access time tCE.

The precharge timing signal PREZ for generating the bit line resetting signal BRS is generated when the selector SEL1 selects the route containing either the pulse generating circuit PLS2 or PLS3. In a manner to correspond to the operation state (or the access operation or the refresh operation) of the pseudo-SRAM, therefore, it is possible to switch the generation timing of the bit line resetting signal BRS easily.

In the BRS generating circuit 28, the drain of the pMOS transistor PM1 and the source of the nMOS transistor NM1 are connected with the source of the pMOS transistor of the CMOS inverter INV1. By merely changing the source voltage of the pMOS transistor of the CMOS inverter INV1, therefore, the high-level voltage of the bit line resetting signal BRS can be easily set.

In the BRS generating circuit 28, the high-level voltage to be supplied to the gates of the pMOS transistor PM1 and the nMOS transistor NM1 is set to the boost voltage VPP by the level shifter SFT. When the nMOS transistor NM1 is turned ON, therefore, it is possible to raise the gate-to-source voltage. As a result, the internal supply voltage VII can be reliably supplied as the high-level voltage to the CMOS inverter INV1.

Figure 11:
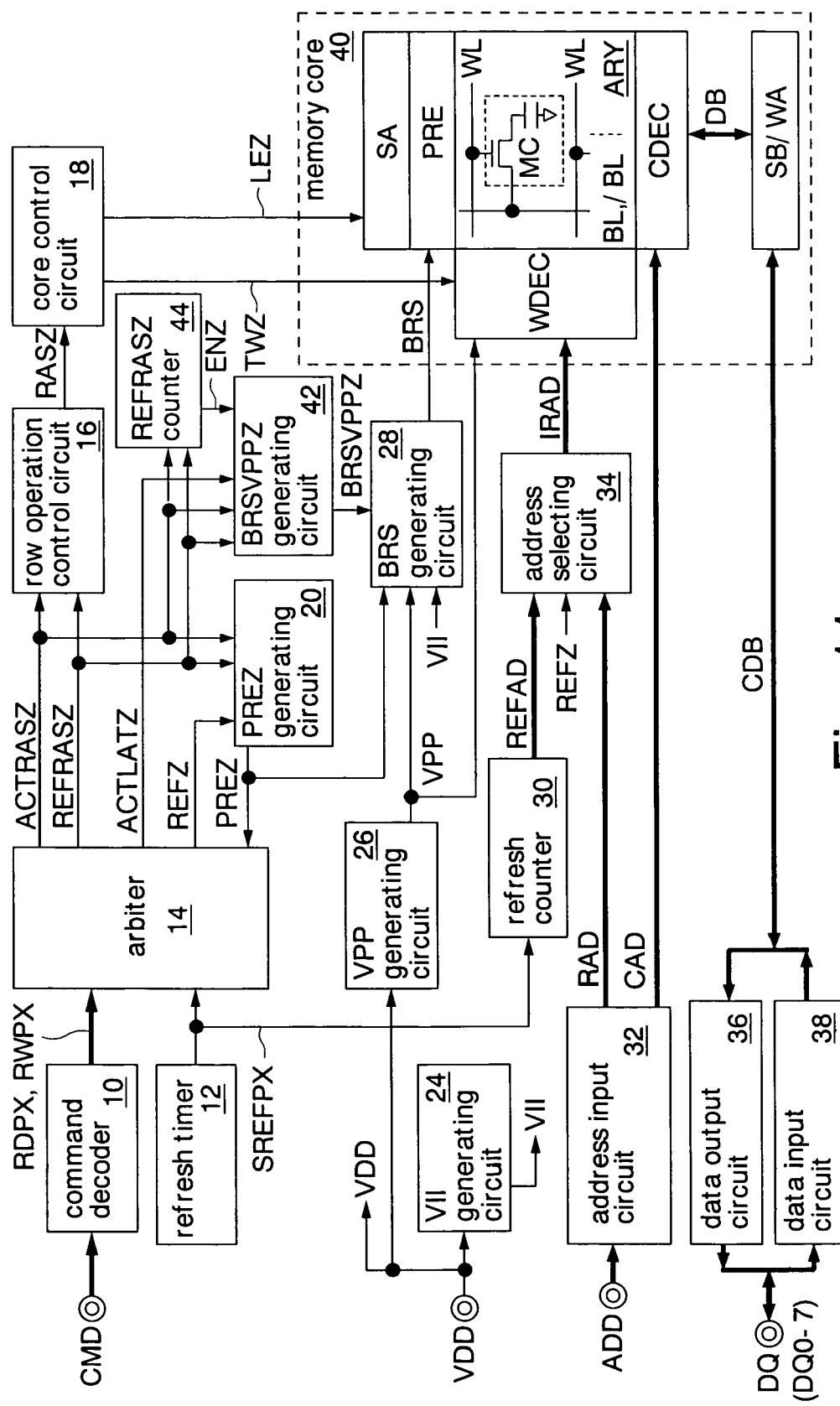
FIG. 11 is a block diagram showing a second embodiment of the semiconductor memory of the invention.

FIG. 11 shows a second embodiment of the semiconductor memory of the invention. The same components as those described in the first embodiment are designated by the common reference numerals, and their detailed descriptions are omitted. In this embodiment, the BRSVPPZ generating circuit 22 of the first embodiment is replaced by a BRSVPPZ generating circuit 42 (or a switch control circuit). Moreover, a REFRASZ counter 44 is newly formed. The remaining constitution is identical to that of the first embodiment. Specifically, the semiconductor memory is formed as the pseudo-SRAM having a DRAM memory cell (or a dynamic memory cell) and a SRAM interface. This pseudo-SRAM is employed in a work memory mounted on a mobile phone, for example.

The REFRASZ counter 44 performs the counting operation in synchronism with the activation (or the rising edge) of the refresh timing signal REFRASZ, and has its counter value reset in synchronism with the activation (or the rising edge) of the access timing signal ACTRASZ. Moreover, the REFRASZ counter 44 changes an enable signal ENZ to the high level, when it counts the activation of the refresh timing signal REFRASZ continuously twice, and the enable signal ENZ to the low level, when it receives the activation of the access timing signal ACTRASZ. In other words, the enable signal ENZ changes to the high level, when the counter value becomes "2", retains the high level, when the counter value exceeds "2", and changes to the low level, when the counter value is reset to "0".

The BRSVPPZ generating circuit 42 accepts the activation (or the rising edge) of the refresh timing signal REFRASZ only while the enable signal ENZ is at the high level, and changes the BRS setting signal BRSVPPZ from the high level to the low level in response to that activation. In other words, the BRSVPPZ generating circuit 42 inhibits the BRS setting signal BRSVPPZ to take the low level, while the enable signal ENZ is at the low level.

Figure 12:
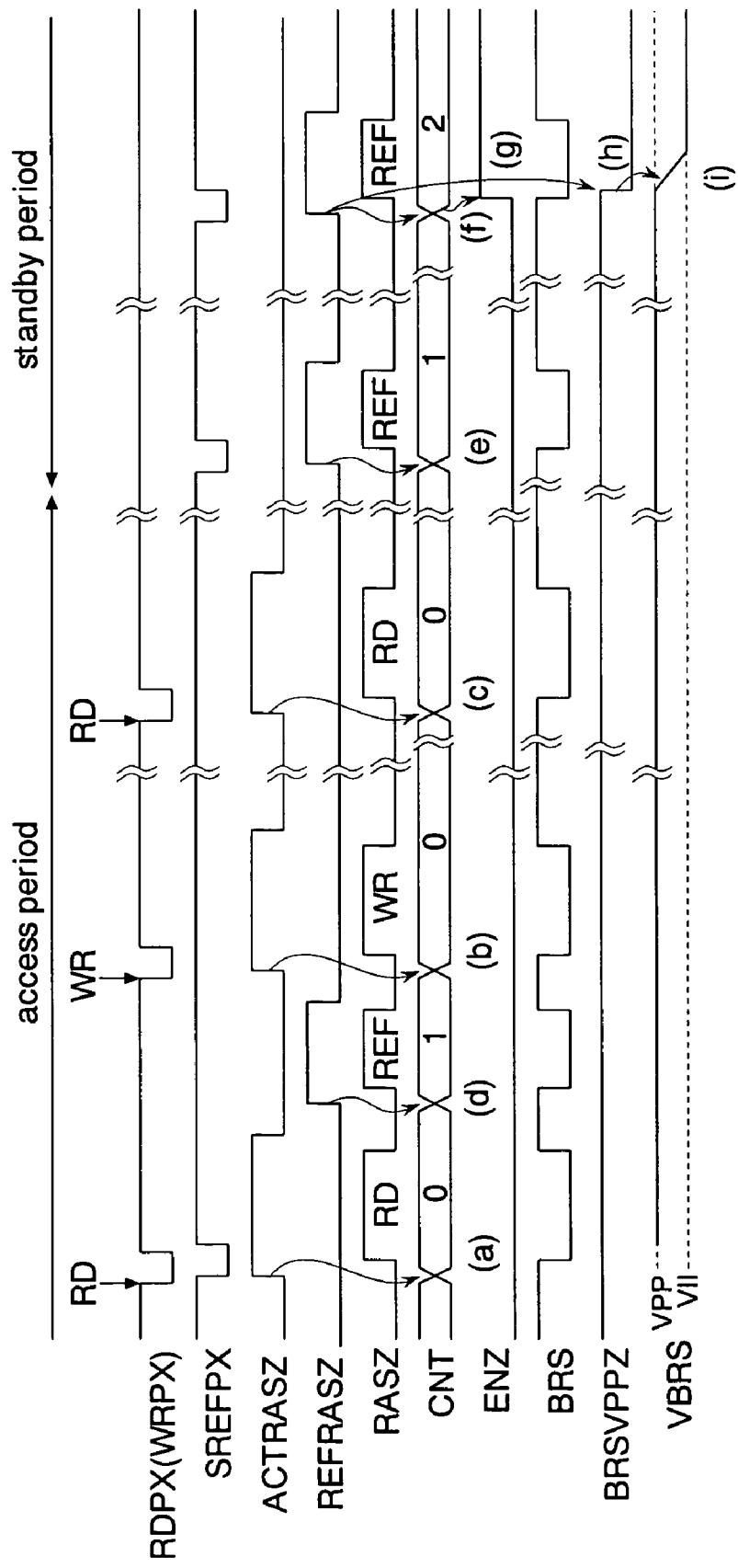
FIG. 12 is a timing chart showing an operation example of a pseudo-SRAM in the second embodiment.

FIG. 12 shows an operation example of the pseudo-SRAM in the second embodiment. In this example, the refresh request SREFPX occurs (for an access period) for the access requests RDPX and WRPX (or the read command RD and the write command WR), and only the refresh request SREFPX then occurs periodically (for a standby period) for the standby period of no access request RDPX and WRPX.

The REFRASZ counter 44, as shown in FIG. 11, resets the counter value CNT to "0" (FIG. 11(*a, b, c*)) in synchronism with the activation of the access timing signal ACTRASZ responding to the access request RDPX (or WRPX). In synchronism with the activation of the refresh timing signal REFRASZ responding to the refresh request SREFPX, on the other hand, the REFRASZ counter 44 performs the counting operation to increase the counter value CNT (FIG. 11 (*d, e, f*)). When the counter value CNT becomes "2", the REFRASZ counter 44 changes the enable signal ENZ from the low level to the high level (FIG. 11(*g*)).

For the period while the enable signal ENZ is at the high level, the BRSVPPZ generating circuit 42 changes the BRS setting signal BRSVPPZ from the high level to the low level in synchronism with the activation of the refresh timing signal REFRASZ (FIG. 11 (*h*)). Here, the BRSVPPZ generating circuit 42 delays the refresh timing signal REFRASZ by a predetermined time period in its inside, so that it may be prevented, before the enable signal ENZ changes to the high level, from receiving the activation of the refresh timing signal REFRASZ.

In response to the BRS setting signal BRSVPPZ of the low level, the BRS generating circuit 28 changes the high-level voltage VBRS of the bit line resetting signal BRS from the boost voltage VPP to the internal supply voltage VII (FIG. 11 (*i*)). For the subsequent standby period, therefore, the precharge operation following the refresh operation is executed for a long time. Here, the change timing from the boost voltage VPP to the internal supply voltage VII is set, like the first embodiment, to the low-level period (or the non-precharge period) of the bit line resetting signal BRS.

Thus, the access period and the standby period are decided in dependence upon whether or not the refresh request continuously occurs. The precharge operation for the access period is executed for a short time period, and the precharge operation for the standby period is executed for a long time period, so that the high-level voltage VBRS of the bit line resetting signal BRS can be prevented from changing from the boost voltage VPP to the internal supply voltage VII during the access period. As a result, the frequency of the switching operations of the high-level voltage VBRS by the BRS generating circuit 28 can be lowered to reduce not only the standby current but also the current consumption (or the operation current) for the access period. By executing the precharge operation after the refresh operation during the access period for short time, moreover, it is possible to shorten the read cycle time tRC and the write cycle time tWC or the minimum supply interval of the access commands RD and WR.

In this embodiment, too, it is possible to acquire effects like those of the aforementioned first embodiment. In this embodiment, moreover, the high-level voltage VBRS is switched from the boost voltage VPP to the internal supply voltage VII when the refresh request SREFPX occurs continuously without interposing the access request RDPX (or WRPX). Moreover, the high-level voltage VBRS is switched from the internal supply voltage VII to the boost voltage VPP when the access request RDPX (or WRPX) occurs. During the normal action period for which the access operation is frequently executed, therefore, the high-level voltage VBRS can be prevented from being changed from the boost voltage VPP to the internal supply voltage VII in response to the refresh request SREFPX. As a result, it is possible to reduce the current consumption of the BRS generating circuit 28.

Figure 13:
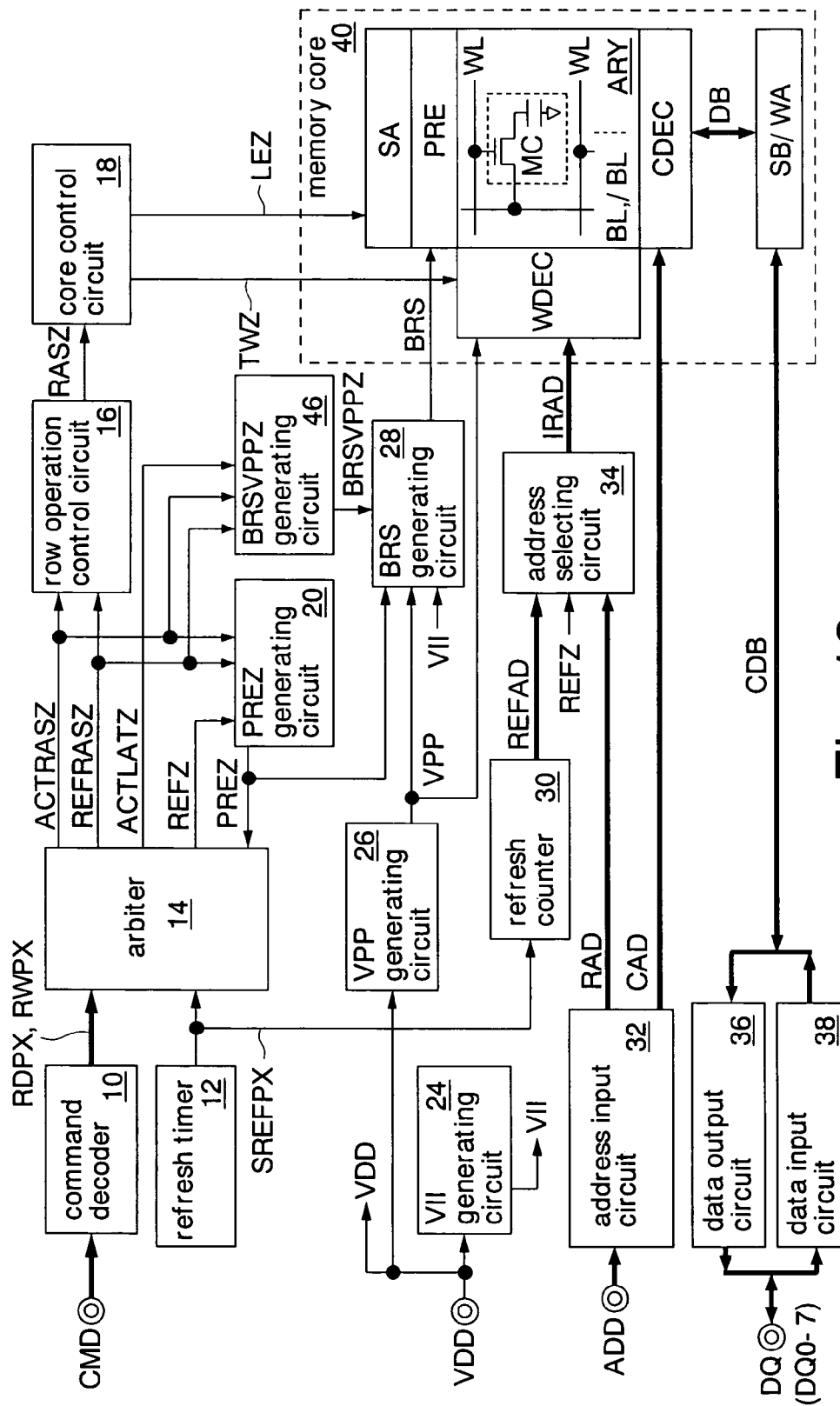
FIG. 13 is a block diagram showing a third embodiment of the semiconductor memory of the invention.

FIG. 13 shows a third embodiment of the semiconductor memory of the invention. The same components as those described in the first embodiment are designated by the common reference numerals, and their detailed descriptions are omitted. In this embodiment, the BRSVPPZ generating circuit 22 of the first embodiment is replaced by a BRSVPPZ generating circuit 46 (or a switch control circuit). The remaining constitution is identical to that of the first embodiment. Specifically, the semiconductor memory is formed as the pseudo-SRAM having a DRAM memory cell (or a dynamic memory cell) and a SRAM interface. This pseudo-SRAM is employed in a work memory mounted on a mobile phone, for example.

The BRSVPPZ generating circuit 46 has a function, when the access request (RDPX or WRPX) occurs during the precharge operation after the refresh operation, to switch the high-level voltage VBRS of the bit line resetting signal BRS from the internal supply voltage VII to the boost voltage VPP during the precharge operation.

Figure 14:
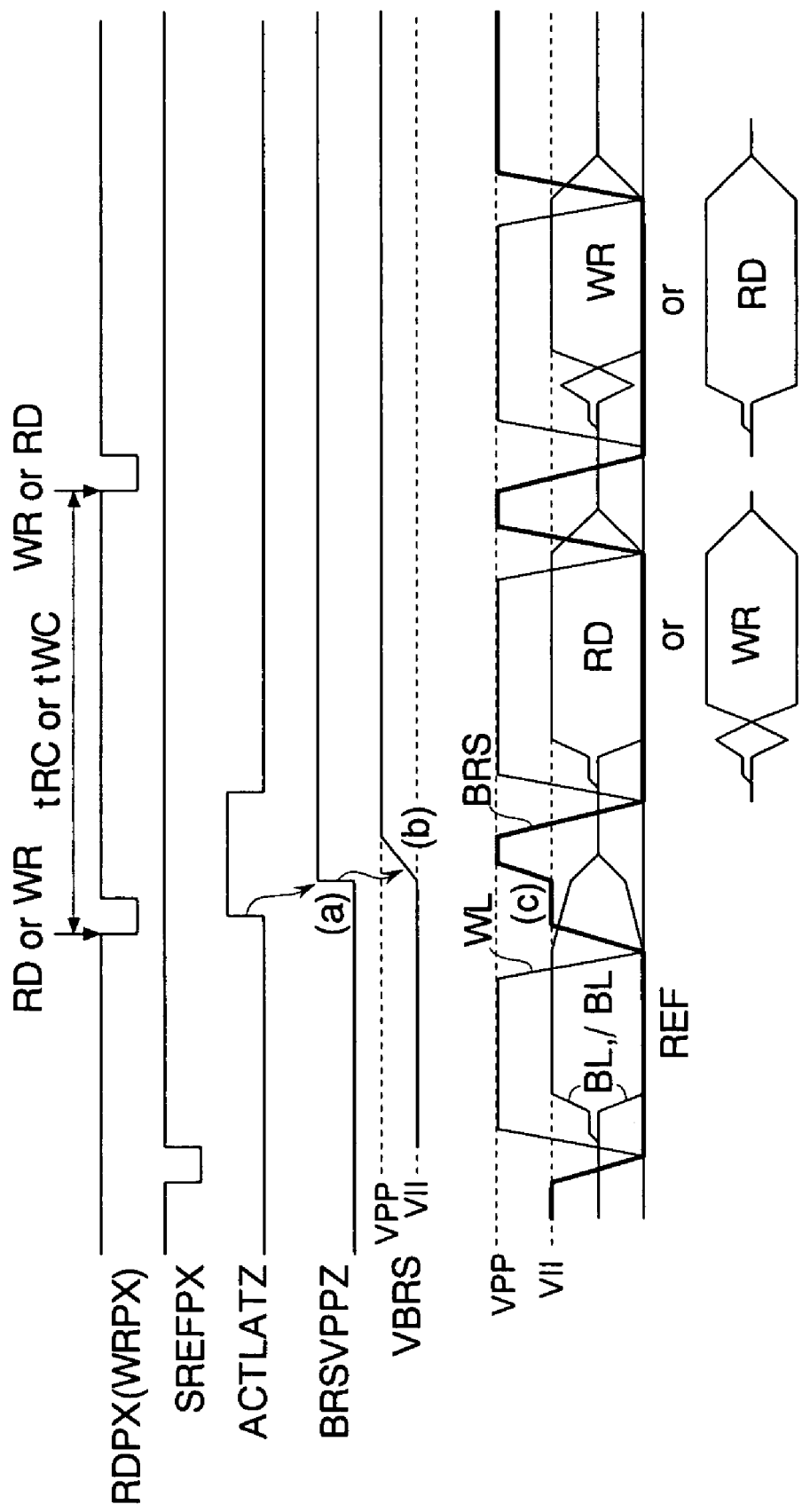
FIG. 14 is a timing chart showing an example of the third embodiment, in which an access command is supplied during a precharge period after a refresh operation.

FIG. 14 shows an example of the third embodiment, in which the access command (RD or WR) is supplied during the precharge operation after the refresh operation REF. The BRSVPPZ generating circuit 46 receives the access latch signal ACTLATZ activated in response to the access command, and changes the BRS setting signal BRSVPPZ from the low level to the high level in synchronism with the access latch signal ACTLATZ (FIG. 14(*a*)). The BRS generating circuit 28 receives the BRS setting signal BRSVPPZ at the high level, and changes the high-level voltage VBRS of the bit line resetting signal BRS from the internal supply voltage VII to the boost voltage VPP (FIG. 14(*b*)). As a result, the high-level voltage of the bit line resetting signal BRS is switched during the precharge operation from the internal supply voltage VII to the boost voltage VPP (FIG. 14(*c*)). Therefore, it is possible to shorten the precharge period after the refresh operation REF. As a result, the time period from the reception of the access command to the start of the access operation (or the read operation RD or the write operation WR) can be shortened to shorten the access cycle time tRC and tWC.

This embodiment can also attain effects similar to those of the aforementioned first embodiment. In this embodiment, moreover, when the access request RDPX (or WRPX) is supplied during the precharge operation responding to the refresh request SREFPX, the high-level voltage VBRS is switched during the precharge operation from the internal supply voltage VII to the boost voltage VPP. Accordingly, the voltage of the bit line resetting signal BRS is switched during the precharge operation from the internal supply voltage VII to the boost voltage VPP. As a result, the refresh request SREFPX and the access request RDPX (or WRPX) conflict so that the access operation is executed after the refresh operation, it is possible to shorten the precharge operation time due to the refresh operation. As a result, the access operation can be started earlier to shorten the access cycle time (tRC, tWC).

The invention is not limited to the above embodiments and various modifications may be made without departing from the spirit and scope of the invention. Any improvement may be made in part or all of the components.

What is claimed is:

1. A semiconductor memory comprising:
a memory core including dynamic memory cells, a bit line connected with said dynamic memory cells, and a precharge circuit having an nMOS transistor connecting said bit line with a precharge voltage line;
a switch circuit which outputs one of a first voltage and a second voltage higher than the first voltage in response to a switch control signal; and
a signal generating circuit which generates a bit line resetting signal to be supplied to the gate of said nMOS transistor and which sets a high-level voltage of said bit line resetting signal to one of said first and second voltages outputted from said switch circuit,
wherein said first voltage is set during a first precharge operation corresponding to a first request and said second voltage is set during a second precharge operation corresponding to a second request.

2. The semiconductor memory according to claim 1,
wherein said second precharge operation follows an access operation which responds to said the second request, and
wherein said first precharge operation follows a refresh operation which responds to said first request.

3. The semiconductor memory according to claim 2, wherein:
said switch control circuit sets said switch control signal to a first logic level in response to a first internal refresh request after said access operation, and sets said switch control signal to a second logic level in response to a first access request after said refresh operation; and
said switch circuit outputs said first voltage when said switch control signal is at the first logic level and outputs said second voltage when said switch control signal is at the second logic level.

4. The semiconductor memory according to claim 2, wherein said switch control circuit switches the logic level of said switch control signal during a period in which said bit line resetting signal is at a low logic level, so as to switch said switch circuit during the low logic level period.

5. The semiconductor memory according to claim 2, further comprising an arbiter which determines, when said first request and said second request conflict with each other, an order to execute an access operation that responds to said second request and an refresh operation that responds to said first request, and which sequentially outputs an access control signal to execute said access operation and a refresh control signal to execute said refresh operation in accordance with the order of execution,
wherein: said switch control circuit sets said switch control signal to a first logic level in response to said refresh control signal, and sets said switch control signal to a second logic level in response to said access control signal; and said switch circuit outputs said first voltage when said switch control signal is at the first logic level, and outputs said second voltage when said switch control signal is at the second logic level.

6. The semiconductor memory according to claim 5, wherein when said second request is supplied during the refresh operation corresponding to said first request, said switch control circuit changes said switch control signal from the first logic level to the second logic level in response to said second request.

7. The semiconductor memory according to claim 1, further comprising:
a boost voltage generating circuit which generates a boost voltage by boosting an external supply voltage; and an internal supply voltage generating circuit which generates an internal supply voltage by stepping down the external supply voltage supplied through a power supply terminal,
wherein: said first voltage is said internal supply voltage; and said second voltage is said boost voltage.

8. The semiconductor memory according to claim 1, further comprising
a switch control circuit which outputs said switch control signal so as to switch the high-level voltage of said bit line resetting signal from said second voltage to said first voltage when said first request occurs continuously without interposing said second request, and to switch said high-level voltage from said first voltage to said second voltage when said second request occurs.

9. The semiconductor memory according to claim 8, wherein said switch control circuit switches the logic level of said switch control signal during a period in which said bit line resetting signal is at a low logic level, so as to switch said switch circuit during the low logic level period.

10. The semiconductor memory according to claim 1, further comprising:
an arbiter which determines, when the first request and the second request conflict with each other, an order to execute an access operation that responds to said second request and a refresh operation that responds to said first request, and which sequentially outputs an access control signal to execute said access operation and a refresh control signal to execute said refresh operation in accordance with the order of execution; and
a switch control circuit which outputs said switch control signal when said second request is supplied during a precharge operation responding to said first request, so as to switch, in response to said second request, the high-level voltage of said bit line resetting signal from said first voltage to said second voltage during the precharge operation.

11. The semiconductor memory according to claim 1, further comprising:
a first pulse generating circuit which generates a first precharge timing signal having a first pulse width;
a second pulse generating circuit which generates a second precharge timing signal having a second pulse width shorter than the first pulse width; and
a selecting circuit which selects said first precharge timing signal when said switch circuit outputs said first voltage, and which selects the second precharge timing signal when said switch circuit outputs said second voltage,
wherein said signal generating circuit generates said bit line resetting signal having a high-level voltage period corresponding to the pulse width of said first or second precharge timing signal selected.

12. The semiconductor memory according to claim 1, wherein:
said signal generating circuit includes a CMOS inverter which outputs said bit line resetting signal; and
said CMOS inverter has a pMOS transistor connected at its source with an output of said switch circuit.

13. The semiconductor memory according to claim 1, further comprising:
a level shifter which sets the high-level voltage of said switch control signal to said second voltage, wherein said switch circuit includes:
a pMOS transistor which receives said second voltage at its source, is connected at its drain with an output node, and receives said switch control signal at its gate; and an nMOS transistor which receives said first voltage at its drain, is connected at its source with said output node, and receives said switch control signal at its gate.

14. The semiconductor memory according to claim 1, wherein the first request is an internal refresh request and the second request is an external access request.

15. An operation control method for a semiconductor memory comprising a memory core including a precharge circuit which has dynamic memory cells, a bit line connected with said dynamic memory cells, and an nMOS transistor connecting said bit line to a precharge voltage line, the method comprising:
    setting a high-level voltage to a bit line resetting signal to be supplied to a gate of said nMOS transistor to a first voltage during a first precharge operation corresponding to a first request; and
    setting the high-voltage to the bit line resetting signal to be supplied to a gate of said nMOS transistor to a second voltage higher than the first voltage during a second precharge operation corresponding to a second request.

16. The operation control method according to claim 15,
    wherein said second precharge operation follows an access operation which responds to said second request, and
    wherein said first precharge operation follows a refresh operation which responds to said first request.

17. The operation control method according to claim 16, further comprising;
    setting a voltage of a power supply line to said first voltage in response to a first internal refresh request after said access operation, and
    setting the voltage to said second voltage in response to a first access request after said refresh operation, the voltage being to be used for a high-level voltage of said bit line resetting signal.

18. The operation control method according to claim 16, further comprising:
    switching a voltage of a power supply line to said first voltage or said second voltage during a period in which said bit line resetting signal is at a low logic level, the voltage being to be used for a high-level voltage of said bit line resetting signal.

19. The operation control method according to claim 16, further comprising:
    when said first request and the second request conflict with each other, determining an order to execute the access operation that responds to said second request and the refresh operation that responds to said first request, and sequentially outputting an access control signal to execute said access operation and a refresh control signal to execute said refresh operation in accordance with the order of execution;
    setting the voltage of the power supply line to said first voltage in response to said refresh control signal and setting the voltage to said second voltage in response to said access control signal, the voltage being to be used for the high-level voltage of said bit line resetting signal.

20. The operation control method according to claim 19, further comprising:
    switching the voltage of said power supply line from said first voltage to said second voltage in response to said second request, when said second request is supplied during said refresh operation corresponding to said first request.

21. The operation control method according to claim 15, further comprising:
    switching the high-level voltage of said bit line resetting signal from said second voltage to said first voltage when said first request occurs continuously without interposing said second request, and switching said high-level voltage from said first voltage to said second voltage when said second request occurs.

22. The operation control method according to claim 21, further comprising:
    switching the voltage of the power supply line to said first voltage or said second voltage during a period in which said bit line resetting signal is at a low logic level, the voltage being to be used for the high-level voltage of said bit line resetting signal.

23. The operation control method according to claim 15, further comprising:
    when the first request and the second request conflict with each other, determining an order to execute an access operation which responds to said second request and an refresh operation which responds to said first request, and sequentially outputting an access control signal to execute said access operation and a refresh control signal to execute said refresh operation in accordance with the order of execution; and
    when said second request is supplied during a precharge operation responding to said first request, switching, in response to said second request, the high-level voltage of said bit line resetting signal from said first voltage to said second voltage during said precharge operation.

24. The semiconductor memory according to claim 15, wherein the first request is an internal refresh request and the second request is an external access request.

25. A semiconductor memory comprising:
    a memory core including dynamic memory cells, a bit line coupled with said dynamic memory cells, and a precharge circuit having an nMOS transistor connecting said bit line with a precharge voltage line;
    a switch circuit which outputs one of a first voltage and a second voltage higher than the first voltage in response to a switch control signal, the switch control signal generated based on a first request and a second request; and
    a signal generating circuit which generates a bit line resetting signal to be supplied to the gate of said nMOS transistor and which sets a high-level voltage of said bit line resetting signal to one of said first and second voltages outputted from said switch circuit.

26. The semiconductor memory according to claim 25, wherein the first request is an internal refresh request and the second request is an external access request.

* * * * *